(12) United States Patent
Shindome et al.

(10) Patent No.: US 11,152,480 B2
(45) Date of Patent: Oct. 19, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Aya Shindome, Yokohama (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/799,918

(22) Filed: Feb. 25, 2020

(65) Prior Publication Data

US 2020/0411659 A1 Dec. 31, 2020

(30) Foreign Application Priority Data

Jun. 28, 2019 (JP) .............................. JP2019-121898

(51) Int. Cl.
*H01L 29/51* (2006.01)
*H01L 29/778* (2006.01)
(Continued)

(52) U.S. Cl.
CPC ............ *H01L 29/51* (2013.01); *H01L 29/402* (2013.01); *H01L 29/42316* (2013.01); *H01L 29/7787* (2013.01)

(58) Field of Classification Search
CPC ................. H01L 29/51; H01L 29/7787; H01L 29/42316; H01L 29/402; H01L 29/404;
(Continued)

(56) References Cited

U.S. PATENT DOCUMENTS

2010/0314666 A1 12/2010 Saito et al.
2012/0267639 A1 10/2012 Jeon et al.
(Continued)

FOREIGN PATENT DOCUMENTS

JP 2010-287732 A 12/2010
JP 2012-231128 A 11/2012
(Continued)

*Primary Examiner* — Syed I Gheyas
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first conductive member, a first semiconductor layer, a second semiconductor layer, and an insulating member. The third electrode is between the first electrode and the second electrode. The first conductive member is electrically connected to the first electrode. The first conductive member is between the third electrode and the second electrode. The first semiconductor layer includes $Al_{x1}Ga_{1-x1}N$ and includes first, second, third, fourth, and fifth partial regions. The second semiconductor layer includes $Al_{x2}Ga_{1-x2}N$ and includes a first semiconductor region and a second semiconductor region. The insulating member includes first, second, third, fourth, and fifth insulating regions. The first insulating region is between the third partial region and the third electrode. The second insulating region is between the fifth partial region and the first conductive member.

14 Claims, 12 Drawing Sheets

(51) Int. Cl.
*H01L 29/423* (2006.01)
*H01L 29/40* (2006.01)

(58) Field of Classification Search
CPC ........... H01L 29/41725; H01L 29/2003; H01L 29/7786
See application file for complete search history.

(56) References Cited

U.S. PATENT DOCUMENTS

| | | | |
|---|---|---|---|
| 2013/0193485 A1* | 8/2013 | Akiyama | H01L 29/778 257/194 |
| 2015/0060948 A1 | 3/2015 | Kawai et al. | |
| 2015/0179782 A1 | 6/2015 | Yamamura | |

FOREIGN PATENT DOCUMENTS

| | | |
|---|---|---|
| JP | 2013-98222 A | 5/2013 |
| JP | 2015-50335 A | 3/2015 |
| JP | 2015-122361 A | 7/2015 |

\* cited by examiner

SEMICONDUCTOR DEVICE

CROSS-REFERENCE TO RELATED APPLICATIONS

This application is based upon and claims the benefit of priority from Japanese Patent Application No. 2019-121898, filed on Jun. 28, 2019; the entire contents of which are incorporated herein by reference.

FIELD

Embodiments described herein relate generally to a semiconductor device.

BACKGROUND

For example, there is a semiconductor device such as a transistor or the like that uses a nitride semiconductor. It is desirable to improve the characteristics of the semiconductor device.

DETAILED DESCRIPTION

Figure 1A:
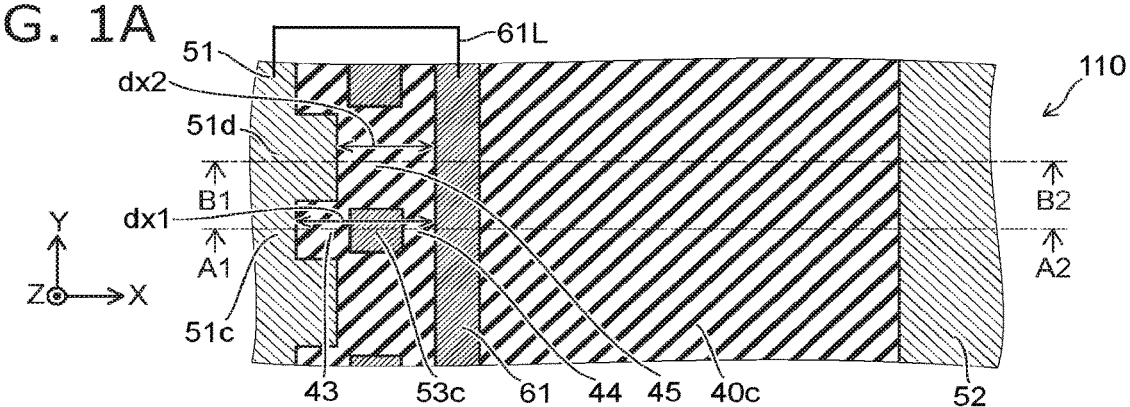
FIG. 1A to FIG. 1D are schematic cross-sectional views illustrating a semiconductor device according to a first embodiment.

According to one embodiment, a semiconductor device includes a first electrode, a second electrode, a third electrode, a first conductive member, a first semiconductor layer, a second semiconductor layer, and an insulating member. A position of the third electrode in a first direction is between a position of the first electrode in the first direction and a position of the second electrode in the first direction. The first direction is from the first electrode toward the second electrode. The first conductive member is electrically connected to the first electrode. A position of the first conductive member in the first direction is between the position of the third electrode in the first direction and the position of the second electrode in the first direction. The first semiconductor layer includes $Al_{x1}Ga_{1-x1}N$ ($0 \leq x1 < 1$) and includes a first partial region, a second partial region, a third partial region, a fourth partial region, and a fifth partial region. A second direction is from the first partial region toward the first electrode and crosses the first direction. A direction from the second partial region toward the second electrode is aligned with the second direction. A direction from the third partial region toward the third electrode is aligned with the second direction. The fourth partial region is between the first partial region and the third partial region in the first direction. The fifth partial region is between the third partial region and the second partial region in the first direction. The second semiconductor layer includes $Al_{x2}Ga_{1-x2}N$ ($0 < x2 < 1$ and $x1 < x2$) and includes a first semiconductor region and a second semiconductor region. A direction from the fourth partial region toward the first semiconductor region is aligned with the second direction. A direction from the fifth partial region toward the second semiconductor region is aligned with the second direction. The insulating member includes a first insulating region, a second insulating region, a third insulating region, a fourth insulating region, and a fifth insulating region. The first insulating region is between the third partial region and the third electrode in the second direction. The second insulating region is between the fifth partial region and the first conductive member in the second direction. The third electrode includes a first portion, a second portion, and a third portion. A direction from the first portion toward the second portion is aligned with a third direction crossing a plane including the first direction and the second direction. The first portion is between the first insulating region and the third portion in the second direction. The first electrode includes a first conductive region, a second conductive region, a third conductive region, and a fourth conductive region. A direction from the first conductive region toward the first portion is aligned with the first direction. A direction from the third conductive region toward the third portion is aligned with the first direction. A direction from the second conductive region toward the second portion is aligned with the first direction. The first conductive region is between the first partial region and the third conductive region in the second direction. The second conductive region is between the first partial region and the fourth conductive region in the second direction. The third insulating region is between the third conductive region and the third portion in the first direction. The fourth insulating region is between the third portion and the first conductive member in the first direction. The fifth insulating region contacts the fourth conductive region and the first conductive member and is between the fourth conductive region and the first conductive member in the first direction.

According to another embodiment, a semiconductor device includes a first electrode, a second electrode, a third electrode, a first conductive member, a first semiconductor layer, a second semiconductor layer, and an insulating member. A position of the third electrode in a first direction is between a position of the first electrode in the first direction and a position of the second electrode in the first direction. The first direction is from the first electrode toward the second electrode. The first conductive member is electrically connected to the first electrode. A position of the first conductive member in the first direction is between the position of the third electrode in the first direction and the position of the second electrode in the first direction. The first semiconductor layer includes $Al_{x1}Ga_{1-x1}N$ (0<x1<1) and includes a first partial region, a second partial region, a third partial region, a fourth partial region, and a fifth partial region. A second direction is from the first partial region toward the first electrode and crosses the first direction. A direction from the second partial region toward the second electrode is aligned with the second direction. A direction from the third partial region toward the third electrode is aligned with the second direction. The fourth partial region is between the first partial region and the third partial region in the first direction. The fifth partial region is between the third partial region and the second partial region in the first direction. The second semiconductor layer includes $Al_{x2}Ga_{1-x2}N$ (0<x2<1 and x1<x2) and includes a first semiconductor region and a second semiconductor region. A direction from the fourth partial region toward the first semiconductor region is aligned with the second direction. A direction from the fifth partial region toward the second semiconductor region is aligned with the second direction. The insulating member includes a first insulating region, a second insulating region, a third insulating region, a fourth insulating region, and a fifth insulating region. The first insulating region is between the third partial region and the third electrode in the second direction. The second insulating region is between the fifth partial region and the first conductive member in the second direction. The third electrode includes a first portion, a second portion, and a third portion. A direction from the first portion toward the second portion is aligned with a third direction crossing a plane including the first direction and the second direction. The first portion is between the first insulating region and the third portion in the second direction. The first electrode includes a first conductive region, a second conductive region, and a third conductive region. A direction from the first conductive region toward the first portion is aligned with the first direction. A direction from the second conductive region toward the second portion is aligned with the first direction. The second conductive region is between the first partial region and the third conductive region in the second direction. The third portion is between the third insulating region and the first conductive member in the first direction. The fourth insulating region is between the third portion and the first conductive member in the first direction. The fifth insulating region contacts the third conductive region and the first conductive member and is between the third conductive region and the first conductive member in the first direction.

According to another embodiment, a semiconductor device includes a first electrode, a second electrode, a third electrode, a first semiconductor layer, a second semiconductor layer, and an insulating member. A position of the third electrode in a first direction is between a position of the first electrode in the first direction and a position of the second electrode in the first direction. The first direction is from the first electrode toward the second electrode. The first semiconductor layer includes $Al_{x1}Ga_{1-x1}N$ (0≤x1<1) and includes a first partial region, a second partial region, a third partial region, a fourth partial region, and a fifth partial region. A second direction is from the first partial region toward the first electrode and crosses the first direction. A direction from the second partial region toward the second electrode is aligned with the second direction. A direction from the third partial region toward the third electrode is aligned with the second direction. The fourth partial region is between the first partial region and the third partial region in the first direction. The fifth partial region is between the third partial region and the second partial region in the first direction. The second semiconductor layer includes $Al_{x2}Ga_{1-x2}N$ (0<x2<1 and x1<x2) and includes a first semiconductor region and a second semiconductor region. A direction from the fourth partial region toward the first semiconductor region is aligned with the second direction. A direction from the fifth partial region toward the second semiconductor region is aligned with the second direction. The insulating member includes a first insulating region. The first insulating region is between the third partial region and the third electrode in the second direction. The third electrode includes a first portion, a second portion, a third portion, and a fourth portion. A direction from the first portion toward the second portion is aligned with a third direction crossing a plane including the first direction and the second direction. The first portion is between the first insulating region and the third portion in the second direction. The second portion is between the first insulating region and the fourth portion in the second direction. The first electrode includes a first conductive region, a second conductive region, a third conductive region, and a fourth conductive region. A direction from the first conductive region toward the first portion is aligned with the first direction. A direction from the second conductive region toward the second portion is aligned with the first direction. The first conductive region is between the first partial region and the third conductive region in the second direction. The second conductive region is between the first partial region and the fourth conductive region in the second direction. A direction from the third conductive region toward the third portion is aligned with the first direction. A direction from the fourth conductive region toward the fourth portion is aligned with the first direction. The third conductive region includes a first end portion at the third portion side. The fourth conductive region includes a second end portion at the fourth portion side. The third portion includes a third end portion at the third conductive region side. The fourth portion includes a fourth end portion at the fourth conductive region side. A position along the first direction of the second end portion is between a position along the first direction of the first end portion and a position along the first direction of the third end portion. The position along the first direction of the third end portion is between the position along the first direction of the second end portion and a position along the first direction of the fourth end portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1D are schematic cross-sectional views illustrating a semiconductor device according to a first embodiment.

Figure 1B:
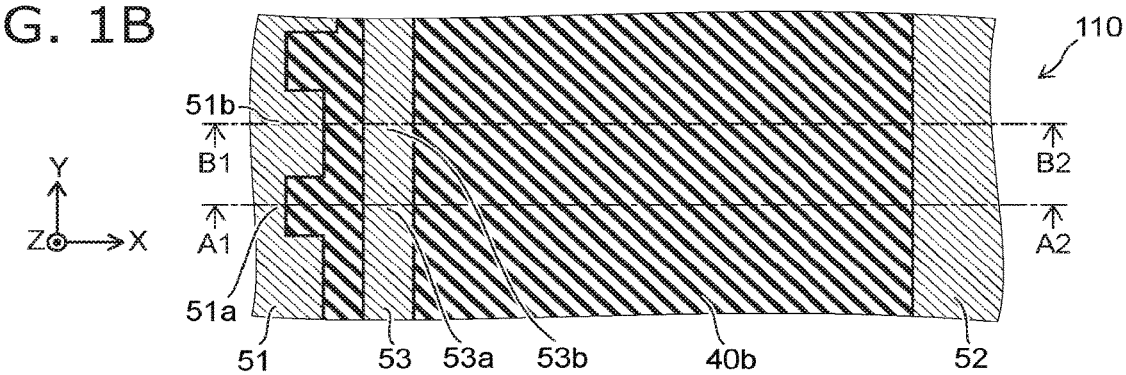
Figure 1C:
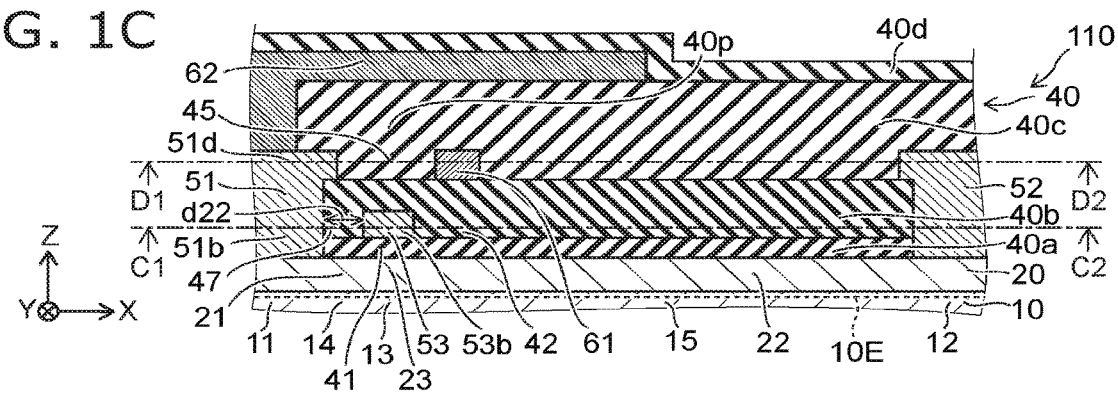
Figure 1D:
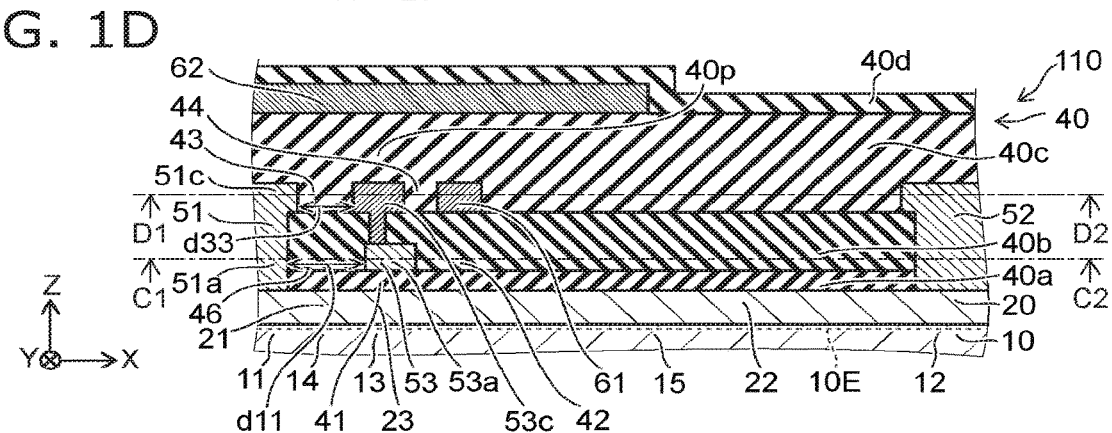

FIG. 1A is a line D1-D2 cross-sectional view of FIG. 1C and FIG. 1D. FIG. 1B is a line C1-C2 cross-sectional view of FIG. 1C and FIG. 1D. FIG. 1C is a line B1-B2 cross-sectional view of FIG. 1A and FIG. 1B. FIG. 1D is a line A1-A2 cross-sectional view of FIG. 1A and FIG. 1B.

As shown in FIG. 1C and FIG. 1D, the semiconductor device 110 according to the embodiment includes a first electrode 51, a second electrode 52, a third electrode 53, a first conductive member 61, a first semiconductor layer 10, a second semiconductor layer 20, and an insulating member 40.

The direction from the first electrode 51 toward the second electrode 52 is taken as a first direction. The first direction is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction (the X-axis direction) is between the position of the first electrode 51 in the first direction and the position of the second electrode 52 in the first direction.

The first conductive member 61 is electrically connected to the first electrode 51. In the example, the first conductive member 61 is electrically connected to the first electrode 51 by an interconnect 61L (referring to FIG. 1A). The interconnect 61L may be provided at any position.

As shown in FIG. 1C and FIG. 1D, the position of the first conductive member 61 in the first direction (the X-axis direction) is between the position of the third electrode 53 in the first direction and the position of the second electrode 52 in the first direction.

The first semiconductor layer 10 includes $Al_{x1}Ga_{1-x1}N$ ($0 \leq x1 < 1$). The first semiconductor layer 10 includes, for example, GaN. The composition ratio x1 of Al in the first semiconductor layer 10 is, for example, not less than 0 and not more than 0.2. The first semiconductor layer 10 includes, for example, a nitride semiconductor.

As shown in FIG. 1C and FIG. 1D, the first semiconductor layer 10 includes a first partial region 11, a second partial region 12, a third partial region 13, a fourth partial region 14, and a fifth partial region 15. The direction from the first partial region 11 toward the second partial region 12 is aligned with the first direction (the X-axis direction). A second direction from the first partial region 11 toward the first electrode 51 crosses the first direction (the X-axis direction). The second direction is, for example, the Z-axis direction. Hereinbelow, the second direction is taken as the Z-axis direction. The direction from the second partial region 12 toward the second electrode 52 is aligned with the second direction. The direction from the third partial region 13 toward the third electrode 53 is aligned with the second direction. The fourth partial region 14 is between the first partial region 11 and the third partial region 13 in the first direction (the X-axis direction). The fifth partial region 15 is between the third partial region 13 and the second partial region 12 in the first direction (the X-axis direction).

The second semiconductor layer 20 includes $Al_{x2}Ga_{1-x2}N$ ($0 < x2 < 1$ and $x1 < x2$). The second semiconductor layer 20 includes, for example, AlGaN. The composition ratio x2 of Al in the second semiconductor layer 20 is, for example, greater than 0.1 and less than 1. The composition ratio x2 of Al in the second semiconductor layer 20 may be, for example, greater than 0.1 and not more than 0.5. The second semiconductor layer 20 includes, for example, a nitride semiconductor.

As shown in FIG. 1C and FIG. 1D, the second semiconductor layer 20 includes a first semiconductor region 21 and a second semiconductor region 22. The direction from the fourth partial region 14 toward the first semiconductor region 21 is aligned with the second direction (e.g., the Z-axis direction). The direction from the fifth partial region 15 toward the second semiconductor region 22 is aligned with the second direction. In the example, the second semiconductor layer 20 further includes a third semiconductor region 23. The direction from the third partial region 13 toward the third semiconductor region 23 is aligned with the Z-axis direction.

The insulating member 40 includes a first insulating region 41, a second insulating region 42, a third insulating region 43, a fourth insulating region 44, and a fifth insulating region 45. The first insulating region 41 is between the third partial region 13 and the third electrode 53 in the second direction (e.g., the Z-axis direction). The third semiconductor region 23 is between the third partial region 13 and the first insulating region 41 in the second direction (the Z-axis direction). The second insulating region 42 is between the fifth partial region 15 and the first conductive member 61 in the second direction (the Z-axis direction). The third insulating region 43, the fourth insulating region 44, and the fifth insulating region 45 are described below.

For example, the first electrode 51 functions as a source electrode. For example, the second electrode 52 functions as a drain electrode. For example, the third electrode 53 functions as a gate electrode. The semiconductor device 110 is, for example, a transistor. The current that flows between the first electrode 51 and the second electrode 52 can be controlled by the voltage applied to the third electrode 53.

As shown in FIG. 1C and FIG. 1D, a carrier region 10E is formed in a portion of the first semiconductor layer 10 opposing the second semiconductor layer 20. The carrier region 10E is, for example, a two-dimensional electron gas. The semiconductor device 110 is, for example, a HEMT (High Electron Mobility Transistor).

For example, the first conductive member 61 functions as a field plate. The concentration of the electric field is suppressed by the first conductive member 61; and stable characteristics are obtained.

As shown in FIG. 1A, FIG. 1C, and FIG. 1D, the third electrode 53 includes a first portion 53a, a second portion 53b, and a third portion 53c. The direction from the first portion 53a toward the second portion 53b is aligned with a third direction. The third direction crosses a plane (the X-Z plane) including the first direction and the second direction. The third direction is, for example, the Y-axis direction. Hereinbelow, the third direction is taken as the Y-axis direction. The first portion 53a is between the first insulating region 41 and the third portion 53c in the second direction (the Z-axis direction).

As shown in FIG. 1B, FIG. 1C, and FIG. 1D, the first electrode 51 includes a first conductive region 51a, a second conductive region 51b, a third conductive region 51c, and a fourth conductive region 51d. As shown in FIG. 1B, the direction from the first conductive region 51a toward the first portion 53a is aligned with the first direction (the X-axis direction). As shown in FIG. 1A, the direction from the third conductive region 51c toward the third portion 53c is aligned with the first direction (the X-axis direction). As shown in FIG. 1C, the direction from the second conductive region 51b toward the second portion 53b is aligned with the first direction.

As shown in FIG. 1D, the first conductive region 51a is between the first partial region 11 and the third conductive region 51c in the second direction (the Z-axis direction). As shown in FIG. 1C, the second conductive region 51b is between the first partial region 11 and the fourth conductive region 51d in the second direction.

The first conductive region 51a and the second conductive region 51b of the first electrode 51 have ohmic contacts with the first partial region 11. The first conductive region 51a and the second conductive region 51b correspond to a lower layer portion. The third conductive region 51c and the fourth conductive region 51d correspond to an upper layer portion.

The first portion 53a and the second portion 53b of the third electrode 53 correspond to a lower layer portion. The third portion 53c corresponds to an upper layer portion. In the example, the third portion 53c has an island configuration. The resistance of the third electrode 53 is reduced by the third portion 53c.

As shown in FIG. 1A and FIG. 1D, the third insulating region 43 of the insulating member 40 is between the third conductive region 51c and the third portion 53c in the first direction (the X-axis direction). The fourth insulating region 44 is between the third portion 53c and the first conductive member 61 in the first direction.

The fifth insulating region 45 is between the fourth conductive region 51d and the first conductive member 61 in the first direction (the X-axis direction). The fifth insulating region 45 contacts the fourth conductive region 51d and the first conductive member 61.

The third portion 53c is provided in the embodiment. The resistance of the third electrode 53 can be reduced thereby. Thereby, for example, the gate delay is suppressed. For example, good switching characteristics are obtained.

If an electrical short occurs between the third conductive region 51c and the third portion 53c, the source electrode and the gate electrode are electrically connected; therefore, appropriate operations are not obtained. In the embodiment, the island-shaped third portion 53c is provided. The third insulating region 43 is provided between the third portion 53c and the third conductive region 51c; and the fourth insulating region 44 is provided between the third portion 53c and the first conductive member 61; thereby, stable insulation performance is obtained.

As shown in FIG. 1C, the portion (e.g., the second portion 53b) where the third portion 53c is not provided is proximal to the first electrode 51. For example, the distance between the second portion 53b and the second conductive region 51b can be short. For example, the source-gate distance can be shortened. A low on-resistance is obtained thereby.

According to the embodiment, a semiconductor device can be provided in which the characteristics can be improved.

As shown in FIG. 1A, the distance in the first direction (the X-axis direction) between the third conductive region 51c and the first conductive member 61 is taken as a distance dx1. The distance in the first direction between the fourth conductive region 51d and the first conductive member 61 is taken as a distance dx2. The distance dx1 is longer than the distance dx2.

Thus, the end of the upper layer portion of the first electrode 51 at the second electrode 52 side has an uneven configuration. The third conductive region 51c corresponds to a recess; and the fourth conductive region 51d corresponds to a protrusion. The upper layer portion of the third electrode 53 (the third portion 53c) is provided at the portion corresponding to the third conductive region 51c which is the recess. On the other hand, the upper layer portion of the third electrode 53 is not provided at the portion corresponding to the fourth conductive region 51d which is the protrusion. Thereby, a distance d22 along the first direction between the second conductive region 51b and the second portion 53b can be shortened while suppressing electrical shorts between the upper layer portion of the first electrode 51 and the upper layer portion of the third electrode 53. The on-resistance can be reduced easily and stably.

As shown in FIG. 1D, the distance along the first direction (the X-axis direction) between the third conductive region 51c and the third portion 53c is taken as a distance d33. For example, the distance d33 is longer than the distance d22 along the first direction between the second conductive region 51b and the second portion 53b. Electrical shorts can be suppressed easily because the distance d33 is long.

The distance along the first direction (the X-axis direction) between the first conductive region 51a and the first portion 53a is taken as a distance d11. For example, the distance d11 is longer than the distance along the first direction between the second conductive region 51b and the second portion 53b. Electrical shorts can be suppressed easily because the distance d11 is long.

In the example, the third conductive region 51c which is the upper layer portion of the first electrode 51 has a configuration along the first conductive region 51a which is the lower layer portion of the first electrode 51. When the third conductive region 51c has a configuration along the first conductive region 51a, the distance d33 can be long as a result of setting the distance d11 along the first direction between the first conductive region 51a and the first portion 53a to be longer than the distance d22 along the first direction between the second conductive region 51b and the second portion 53b. The distance d33 can be long while shortening the distance d22. For example, a low resistance of the first electrode 51 is obtained easily while obtaining a low on-resistance.

As shown in FIG. 1D, the insulating member 40 may further include a sixth insulating region 46. The sixth insulating region 46 is between the first partial region 11 and a portion of the third conductive region 51c in the second direction (e.g., the Z-axis direction). The sixth insulating region 46 is between the first conductive region 51a and the first portion 53a in the first direction (the X-axis direction). For example, a portion of the third conductive region 51c is on a portion of the sixth insulating region 46. The portion of the third conductive region 51c corresponds to an "eave". By providing such a "portion" in the third conductive region 51c, the formation of the first electrode 51 is easy.

As shown in FIG. 1C, the insulating member 40 may further include a seventh insulating region 47. The seventh insulating region 47 is between the first partial region 11 and a portion of the fourth conductive region 51d in the second direction (e.g., the Z-axis direction). The seventh insulating region 47 is between the second conductive region 51b and the second portion 53b in the first direction (the X-axis direction). For example, a portion of the fourth conductive region 51d is on a portion of the seventh insulating region 47. The portion of the fourth conductive region 51d corresponds to an "eave". By providing such a "portion" in the fourth conductive region 51d, the formation of the first electrode 51 is easy.

As shown in FIG. 1C and FIG. 1D, the insulating member 40 includes a first layer 40a, a second layer 40b, a third layer 40c, and a fourth layer 40d. The second semiconductor layer 20 is on the first semiconductor layer 10. The first layer 40a is on the second semiconductor layer 20. The second layer 40b is on the first layer 40a. The third layer 40c is on the second layer 40b. The fourth layer 40d is on the third layer 40c.

For example, the first insulating region 41 is included in the first layer 40a. For example, the second insulating region 42, the sixth insulating region 46, and the seventh insulating region 47 are included in the second layer 40b. For example, the third insulating region 43, the fourth insulating region 44, and the fifth insulating region 45 are included in the third layer 40c.

As shown in FIG. 1C and FIG. 1D, the semiconductor device 110 may include a second conductive member 62. The second conductive member 62 is electrically connected to the first electrode 51 (referring to FIG. 1C). The third electrode 53 is between the first insulating region 41 and the second conductive member 62 in the second direction (e.g., the Z-axis direction). As shown in FIG. 1C and FIG. 1D, for example, a portion 40p of the insulating member 40 is between the third electrode 53 and the second conductive member 62 in the second direction (e.g., the Z-axis direction). The second conductive member 62 is between the fourth layer 40d and the portion 40p of the insulating member 40 in the Z-axis direction. For example, the fourth layer 40d protects the second conductive member 62. For example, the second conductive member 62 functions as a field plate. The concentration of the electric field is suppressed by the second conductive member 62. For example, stable characteristics are obtain easily.

As shown in FIG. 1A, multiple third portions 53c may be provided. For example, the multiple third portions 53c are arranged along the third direction (e.g., the Y-axis direction). The fifth insulating region 45 is between one of the multiple third portions 53c and another one of the multiple third portions 53c in the third direction.

Multiple fifth insulating regions 45 may be provided. The third portion 53c is between one of the multiple fifth insulating regions 45 and another one of the multiple fifth insulating regions 45 in the third direction.

The multiple third portions 53c and the multiple fifth insulating regions 45 may be provided. The third portion 53c and the fifth insulating region 45 are arranged alternately along the Y-axis direction.

The ratio of the length along the third direction (e.g., the Y-axis direction) of one of the multiple third portions 53c to the length along the third direction of one of the multiple fifth insulating regions 45 is, for example, not less than 0.1 and not more than 10. Good switching characteristics are easier to obtain thereby.

Figure 2A:
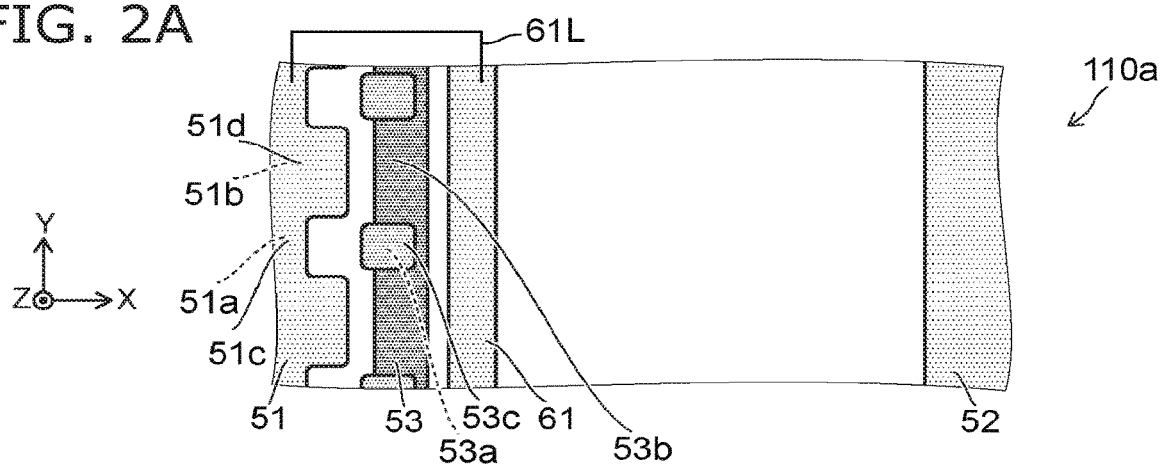
FIG. 2A and FIG. 2B are schematic plan views illustrating semiconductor devices according to the first embodiment.
Figure 2B:
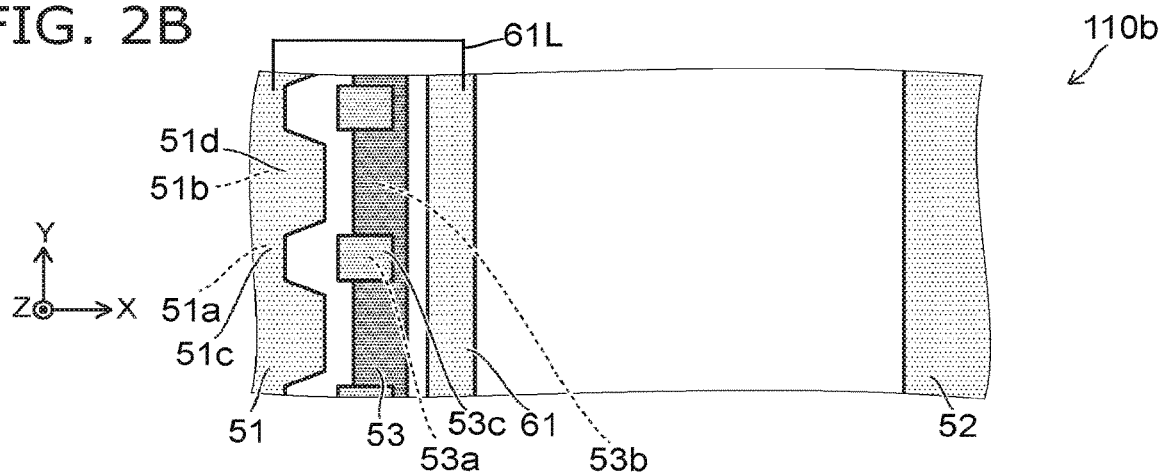

FIG. 2A and FIG. 2B are schematic plan views illustrating semiconductor devices according to the first embodiment.

These drawings are perspective plan views showing examples of the configuration in the X-Y plane of the first electrode 51, the second electrode 52, and the third electrode 53. The insulating member 40 is not illustrated in these drawings.

As in the example of a semiconductor device 110a shown in FIG. 2A, the corners of the third portion 53c of the third electrode may have curvilinear configurations (curved-surface configurations). In the first electrode 51, the corners of each uneven configuration of the first conductive region 51a, the second conductive region 51b, the third conductive region 51c, and the fourth conductive region 51d may have curvilinear configurations (curved-surface configurations).

As in the example of a semiconductor device 110b shown in FIG. 2B, in the first electrode 51, the side portion may be oblique to the X-axis direction for each uneven configuration of the first conductive region 51a, the second conductive region 51b, the third conductive region 51c, and the fourth conductive region 51d.

FIG. 3A to FIG. 3D are schematic cross-sectional views illustrating a semiconductor device according to the first embodiment.

Figure 4:
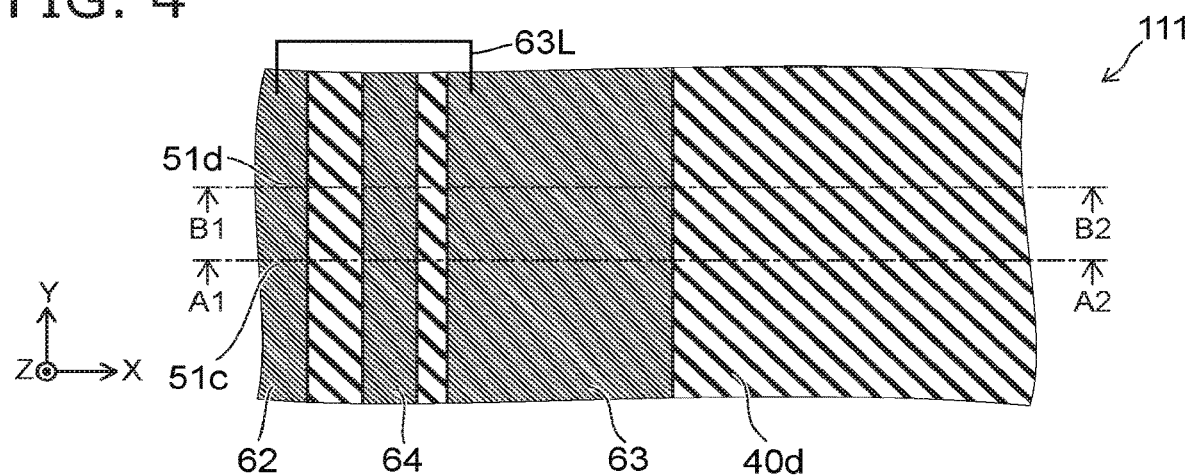
FIG. 4 is a schematic cross-sectional view illustrating the semiconductor device according to the first embodiment.

FIG. 4 is a schematic cross-sectional view illustrating the semiconductor device according to the first embodiment.

Figure 3A:
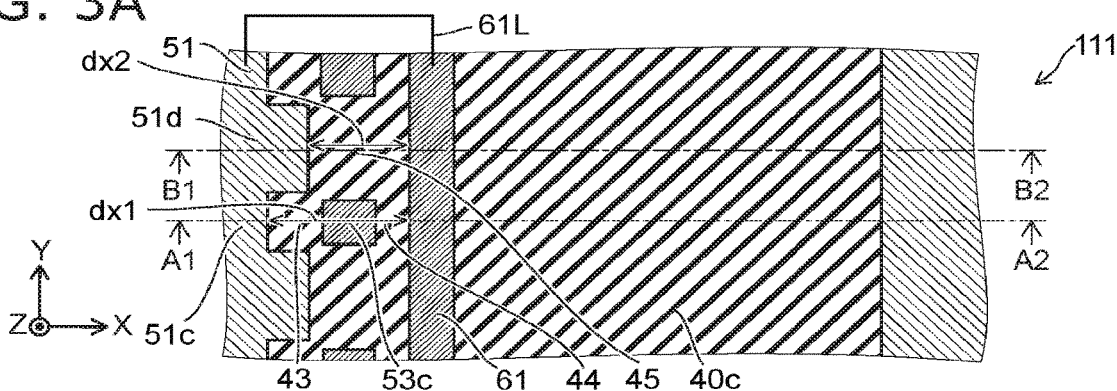
FIG. 3A to FIG. 3D are schematic cross-sectional views illustrating a semiconductor device according to the first embodiment.
Figure 3B:
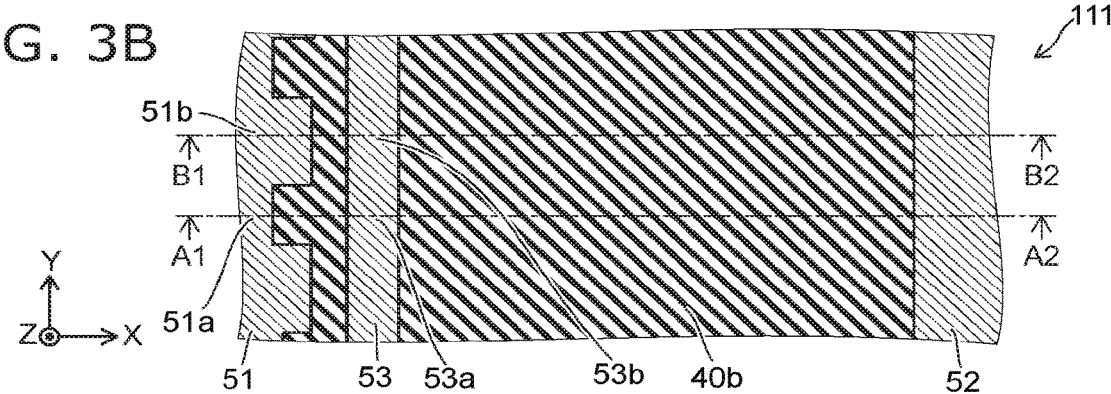
Figure 3C:
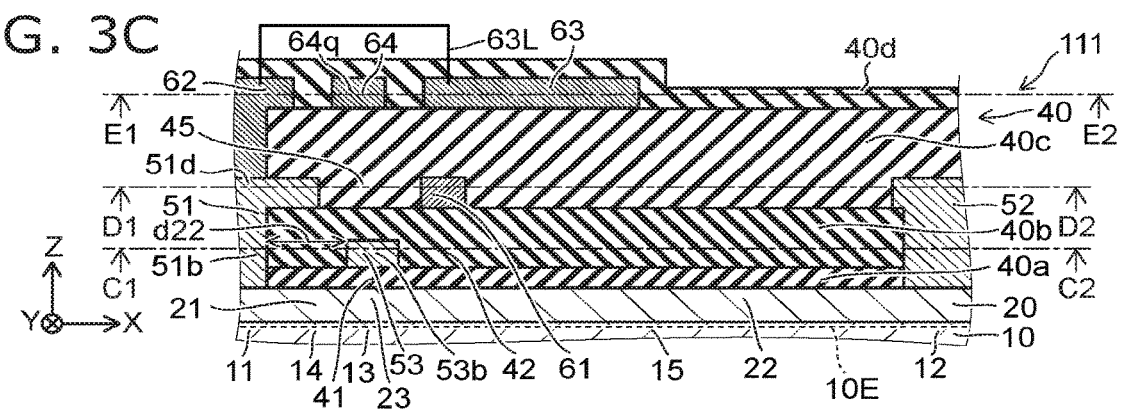
Figure 3D:
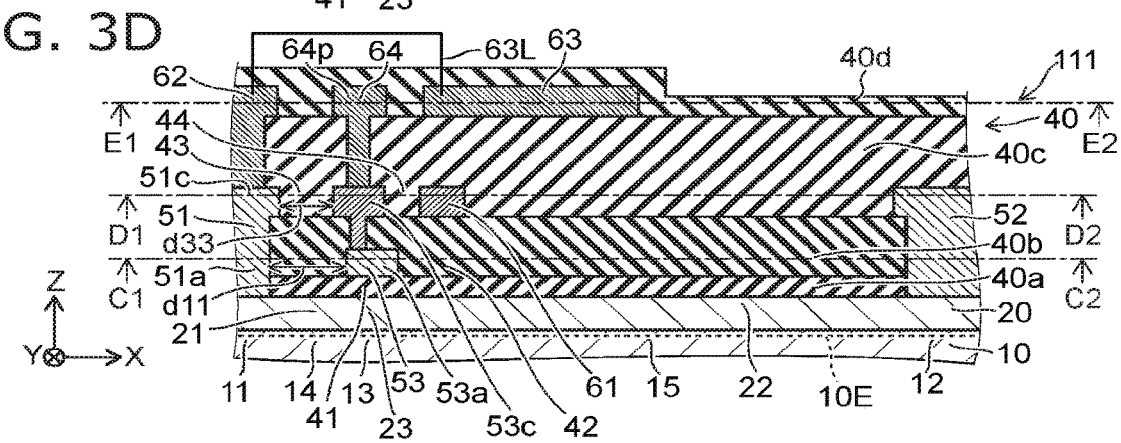

FIG. 3A is a line D1-D2 cross-sectional view of FIG. 3C and FIG. 3D. FIG. 3B is a line C1-C2 cross-sectional view of FIG. 3C and FIG. 3D. FIG. 3C is a line B1-B2 cross-sectional view of FIG. 3A and FIG. 3B. FIG. 3D is a line A1-A2 cross-sectional view of FIG. 3A and FIG. 3B. FIG. 4 is a line E1-E2 cross-sectional view of FIG. 3C and FIG. 3D.

As shown in FIG. 3C and FIG. 3D, the semiconductor device 111 includes the second conductive member 62, a third conductive member 63, and a fourth conductive member 64 in addition to the first electrode 51, the second electrode 52, the third electrode 53, the first conductive member 61, the first semiconductor layer 10, the second semiconductor layer 20, and the insulating member 40. Otherwise, the configuration of the semiconductor device 111 is similar to that of the semiconductor device 110. Examples of the second conductive member 62, the third conductive member 63, and the fourth conductive member 64 of the semiconductor device 111 will now be described.

The second conductive member 62 and the third conductive member 63 are electrically connected to the first electrode 51. As shown in FIG. 3C and FIG. 3D, the second conductive member 62 is connected to the third conductive region 51c and the fourth conductive region 51d. For example, the second conductive member 62 is continuous with the third conductive region 51c and the fourth conductive region 51d. Thereby, the second conductive member 62 is electrically connected to the first electrode 51.

As shown in FIG. 3C, FIG. 3D, and FIG. 4, the third conductive member 63 is electrically connected to the third conductive region 51c and the fourth conductive region 51d via an interconnect 63L. Thereby, the third conductive member 63 is electrically connected to the first electrode 51. For example, the third conductive member 63 functions as a field plate. The interconnect 63L may be provided at any position.

As shown in FIG. 3C and FIG. 3D, the first electrode 51 is between the first partial region 11 and the second conductive member 62 in the second direction (e.g., the Z-axis direction). For example, by providing the second conductive member 62, the resistance of the source electrode can be reduced.

The first conductive member 61 is between the second insulating region 42 and the third conductive member 63 in the second direction (the Z-axis direction). The position of the third electrode 53 in the first direction (the X-axis direction) is between the position of the second conductive member 62 in the first direction and the third conductive member 63 in the first direction.

The fourth conductive member 64 is electrically connected to the third electrode 53. In the example as shown in FIG. 3D, the fourth conductive member 64 is connected to the third portion 53c. The fourth conductive member 64 is between the second conductive member 62 and the third conductive member 63 in the first direction (the X-axis direction). For example, the resistance of the gate electrode can be reduced by the fourth conductive member 64.

As shown in FIG. 3C, the fifth insulating region 45 is between the fourth conductive member 64 and the second portion 53b of the third electrode 53 in the Z-axis direction. The fourth conductive member 64 extends to be continuous along the Y-axis direction. The resistance of the gate electrode can be reduced further by such a fourth conductive member 64.

As shown in FIG. 3D, the third portion 53c is between the first portion 53a and a portion 64p of the fourth conductive member 64 in the second direction (e.g., the Z-axis direction). As shown in FIG. 3C, the fifth insulating region 45 is between the second portion 53b and another portion 64q of the fourth conductive member 64 in the second direction.

FIG. 5A to FIG. 5D are schematic cross-sectional views illustrating a semiconductor device according to the first embodiment.

Figure 6A:
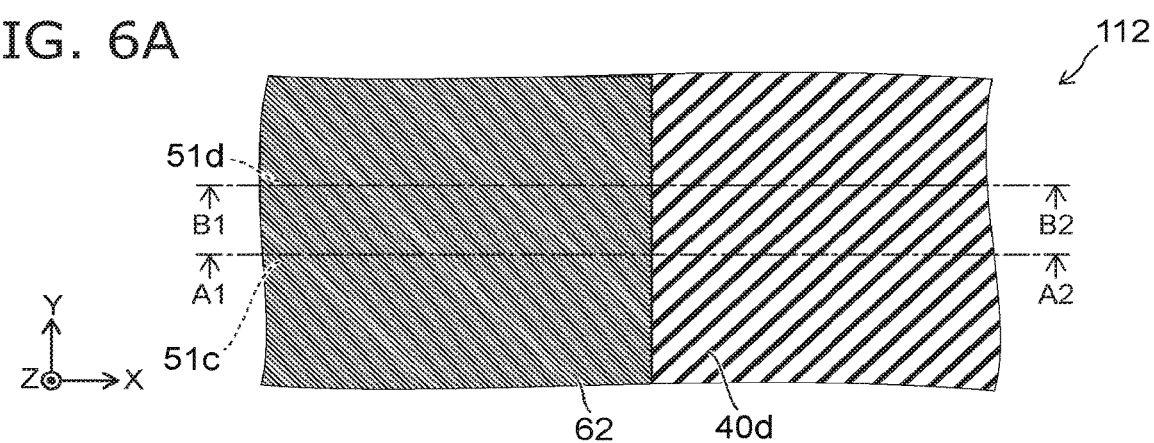
FIG. 6A and FIG. 6B are schematic cross-sectional views illustrating the semiconductor device according to the first embodiment.
Figure 6B:
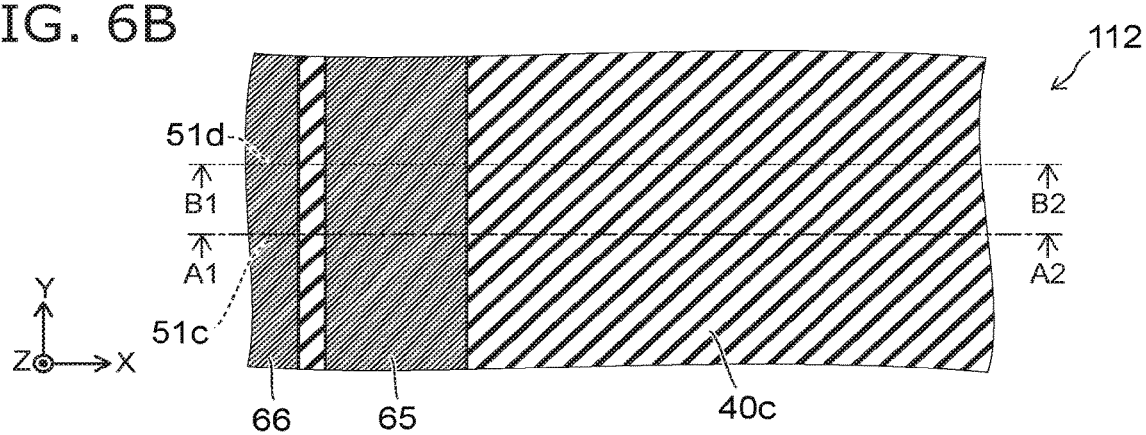

FIG. 6A and FIG. 6B are schematic cross-sectional views illustrating the semiconductor device according to the first embodiment.

Figure 5A:
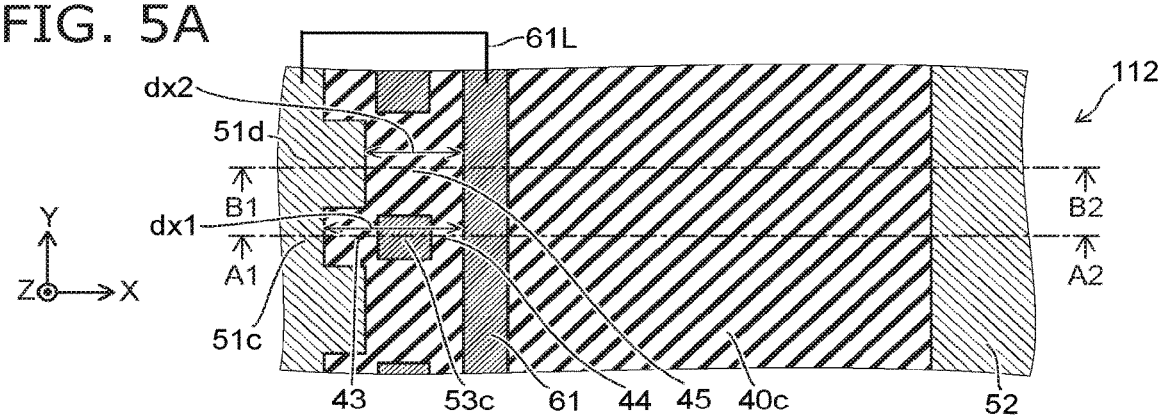
FIG. 5A to FIG. 5D are schematic cross-sectional views illustrating a semiconductor device according to the first embodiment.
Figure 5B:
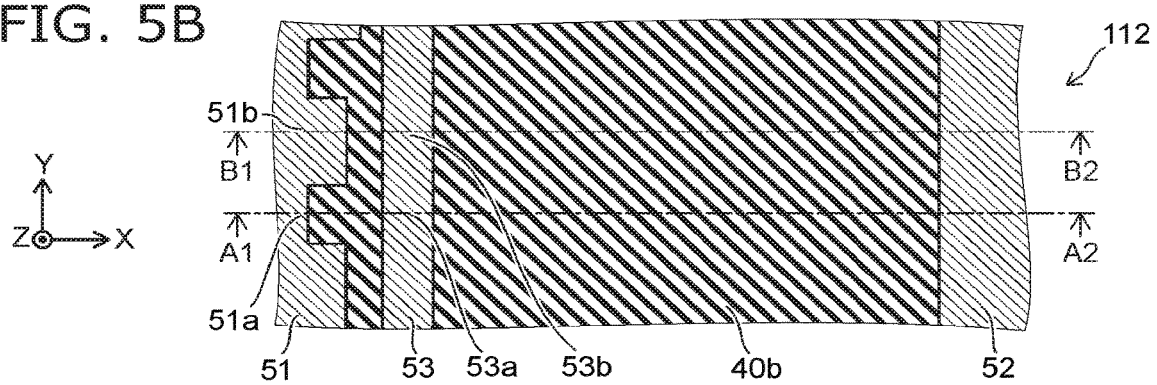
Figure 5C:
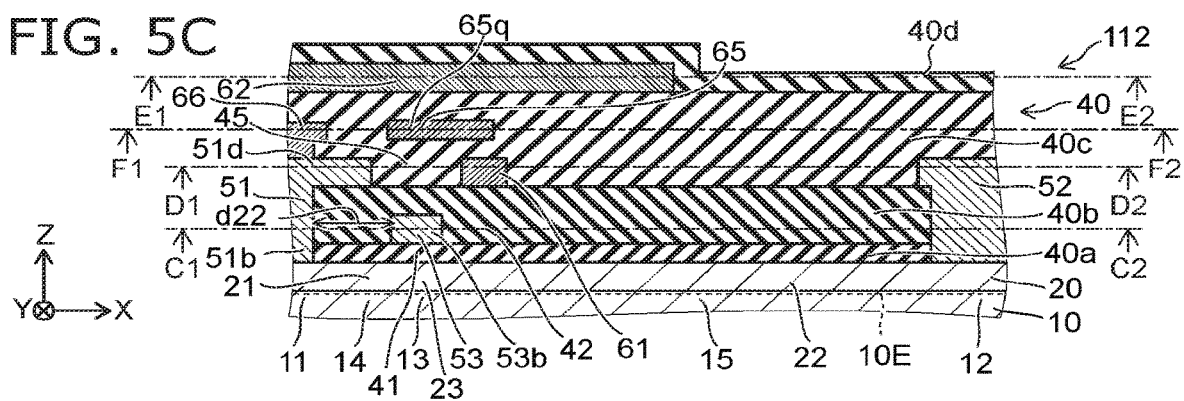
Figure 5D:
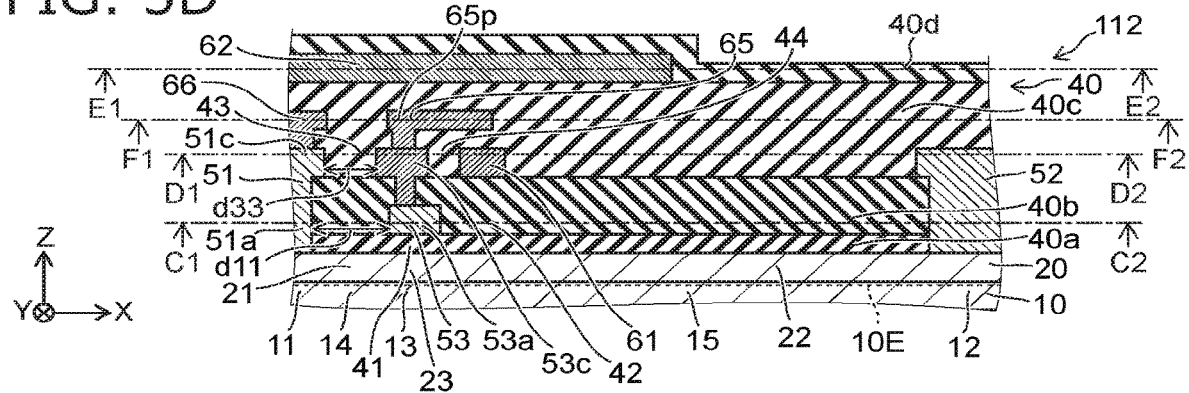

FIG. 5A is a line D1-D2 cross-sectional view of FIG. 5C and FIG. 5D. FIG. 5B is a line C1-C2 cross-sectional view of FIG. 5C and FIG. 5D. FIG. 5C is a line B1-B2 cross-sectional view of FIG. 5A and FIG. 5B. FIG. 5D is a line A1-A2 cross-sectional view of FIG. 5A and FIG. 5B. FIG. 6A is a line E1-E2 cross-sectional view of FIG. 5C and FIG. 5D. FIG. 6B is a line F1-F2 cross-sectional view of FIG. 5C and FIG. 5D.

As shown in FIG. 5C and FIG. 5D, the semiconductor device 112 includes the second conductive member 62, a fifth conductive member 65, and a sixth conductive member 66 in addition to the first electrode 51, the second electrode 52, the third electrode 53, the first conductive member 61, the first semiconductor layer 10, the second semiconductor layer 20, and the insulating member 40. Otherwise, the configuration of the semiconductor device 112 is similar to that of the semiconductor device 110. Examples of the second conductive member 62, the fifth conductive member 65, and the sixth conductive member 66 of the semiconductor device 112 will now be described.

As shown in FIG. 5D, the fifth conductive member 65 is electrically connected to the third electrode 53. In the example, the fifth conductive member 65 is connected to the third portion 53c. The third portion 53c is between the first portion 53a and a portion 65p of the fifth conductive member 65 in the second direction (e.g., the Z-axis direction). As shown in FIG. 5C, the fifth insulating region 45 is between the second portion 53b and another portion 65q of the fifth conductive member 65 in the second direction (e.g., the Z-axis direction). For example, the fifth conductive member 65 may function as a field plate of the gate electrode. The resistance of the gate electrode can be reduced further by the fifth conductive member 65.

As shown in FIG. 5D, the third conductive region 51c is between the first conductive region 51a and the sixth conductive member 66 in the Z-axis direction. As shown in FIG. 5C, the fourth conductive region 51d is between the second conductive region 51b and the sixth conductive member 66 in the Z-axis direction. The resistance of the source electrode can be reduced by the sixth conductive member 66.

As shown in FIG. 5C, FIG. 5D, and FIG. 6B, the direction from the sixth conductive member 66 toward the fifth conductive member 65 is aligned with the X-axis direction. The fifth conductive member 65 is between the third electrode 53 and the second conductive member 62 in the Z-axis direction. The sixth conductive member 66 is between the first electrode 51 and the second conductive member 62 in the Z-axis direction. As shown in FIG. 5C, FIG. 5D, and FIG. 6A, the second conductive member 62 has a continuous band configuration. The first electrode 51, the third electrode 53, the first conductive member 61, the fifth conductive member 65, and the sixth conductive member 66 are between the first semiconductor layer 10 and the second conductive member 62 in the Z-axis direction.

In the semiconductor devices 111 and 112 as well, the distance dx1 in the first direction between the third conductive region 51c and the first conductive member 61 is longer than the distance dx2 in the first direction between the fourth conductive region 51d and the first conductive member 61. By setting the planar configuration of the first electrode 51 to be an uneven configuration, electrical shorts with the third portion 53c can be suppressed. The distance d22 is shortened easily. For example, a low on-resistance is obtained easily.

In the semiconductor devices 111 and 112 as well, the fifth insulating region 45 may be between one of the multiple third portions 53c and another one of the multiple third portions 53c in the third direction. The third portion 53c may be between one of the multiple fifth insulating regions 45 and another one of the multiple fifth insulating regions 45 in the third direction. The third portion 53c and the fifth insulating region 45 may be arranged alternately along the Y-axis direction.

FIG. 7A to FIG. 7D are schematic views illustrating a semiconductor device according to the first embodiment.

Figure 7A:
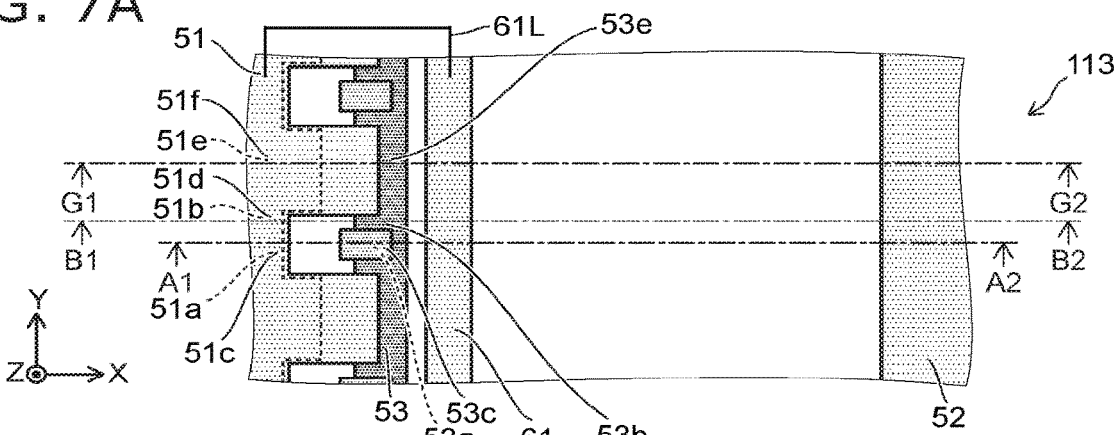
FIG. 7A to FIG. 7D are schematic views illustrating a semiconductor device according to the first embodiment.
Figure 7B:
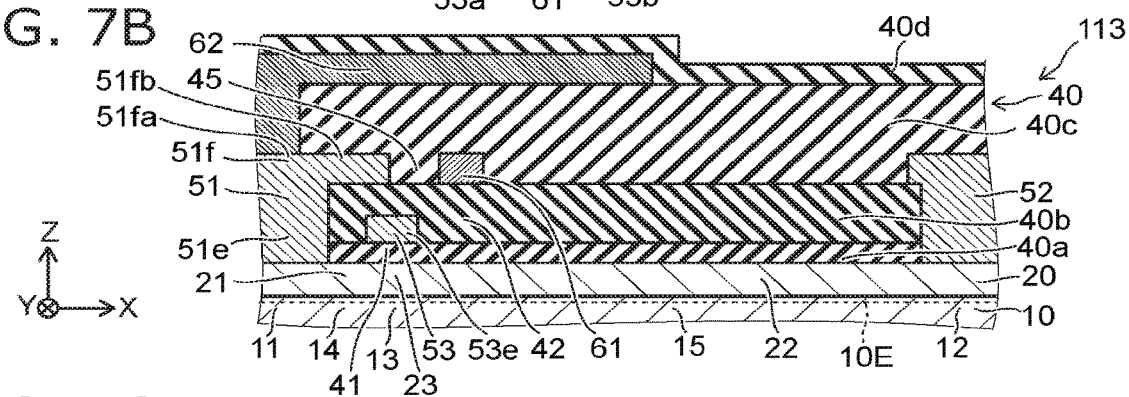
Figure 7C:
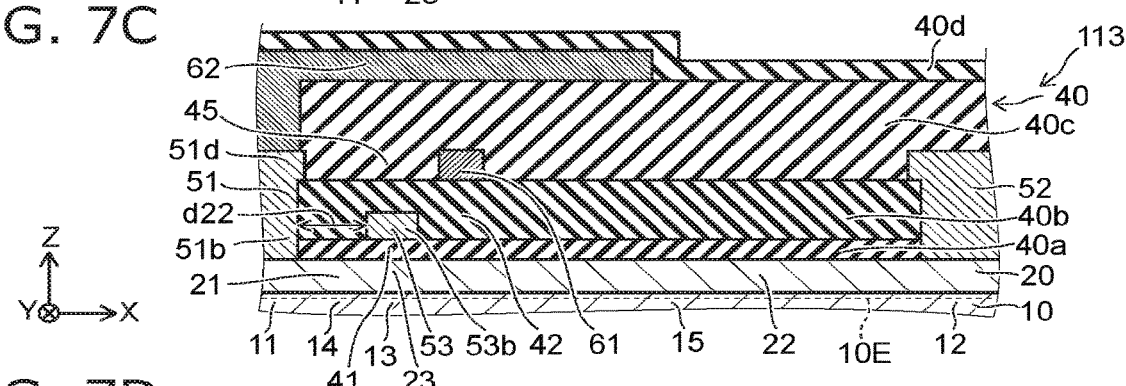
Figure 7D:
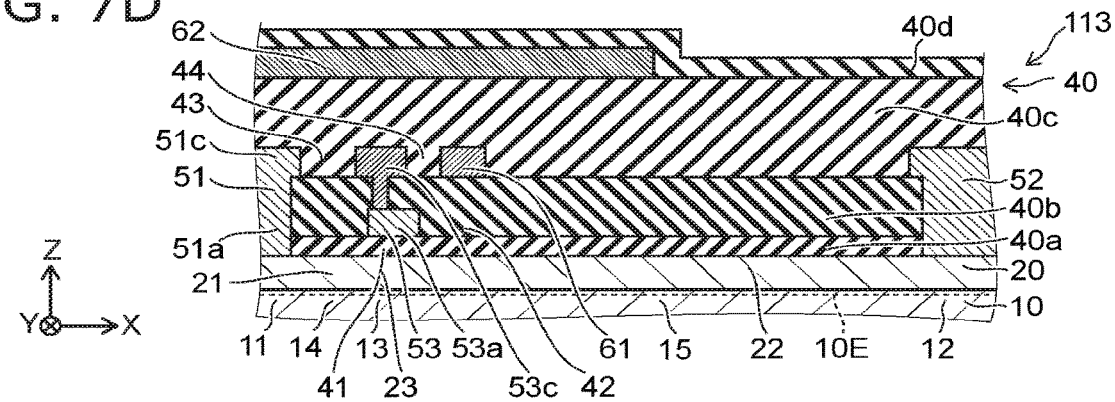

FIG. 7A is a see-through plan view. The planar configuration of the first electrode 51, the second electrode 52, and the third electrode 53 is schematically shown in FIG. 7A. The insulating member 40 is not illustrated in FIG. 7A. FIG. 7B is a line G1-G2 cross-sectional view of FIG. 7A. FIG. 7C is a line B1-B2 cross-sectional view of FIG. 7A. FIG. 7D is a line A1-A2 cross-sectional view of FIG. 7A.

As shown in FIG. 7B, FIG. 7C, and FIG. 7D, the semiconductor device 113 also includes the first electrode 51, the second electrode 52, the third electrode 53, the first conductive member 61, the first semiconductor layer 10, the second semiconductor layer 20, and the insulating member 40. In the semiconductor device 113, the third electrode 53 includes a fifth portion 53e in addition to the first portion 53a, the second portion 53b, the third portion 53c, and a fourth portion 53d. The first electrode 51 includes a fifth conductive region 51e and a sixth conductive region 51f in addition to the first conductive region 51a, the second conductive region 51b, the third conductive region 51c, and the fourth conductive region 51d. Otherwise, the configuration of the semiconductor device 113 may be similar to that of the semiconductor device 110. Examples of the third electrode 53 and the first electrode 51 of the semiconductor device 113 will now be described.

As shown in FIG. 7A, the second portion 53b is between the first portion 53a and the fifth portion 53e in the third direction (e.g., the Y-axis direction). As shown in FIG. 7A, the second conductive region 51b is between the first conductive region 51a and the fifth conductive region 51e in the third direction. The direction from the fifth conductive region 51e toward the fifth portion 53e is aligned with the first direction (the X-axis direction).

As shown in FIG. 7B, the fifth conductive region 51e is between the first partial region 11 and a portion 51fa of the sixth conductive region 51f in the second direction (the Z-axis direction).

As shown in FIG. 7B, at least a portion of the fifth portion 53e is between the first insulating region 41 and another portion 51fb of the sixth conductive region 51f in the second direction (e.g., the Z-axis direction).

The sixth conductive region 51f is the upper layer portion of the first electrode 51. In the semiconductor device 113, a portion of the upper layer portion of the first electrode 51 (a portion 51fb of the sixth conductive region 51f) is on a portion (the fifth portion 53e) of the third electrode 53. Thereby, for example, the resistance of the source electrode can be reduced.

The island-shaped third portion 53c is provided in the semiconductor device 113 as well. The resistance of the third electrode 53 can be reduced. For example, the distance d22

(referring to FIG. 7C) is shortened easily. For example, a low on-resistance is obtained easily.

Figure 8A:
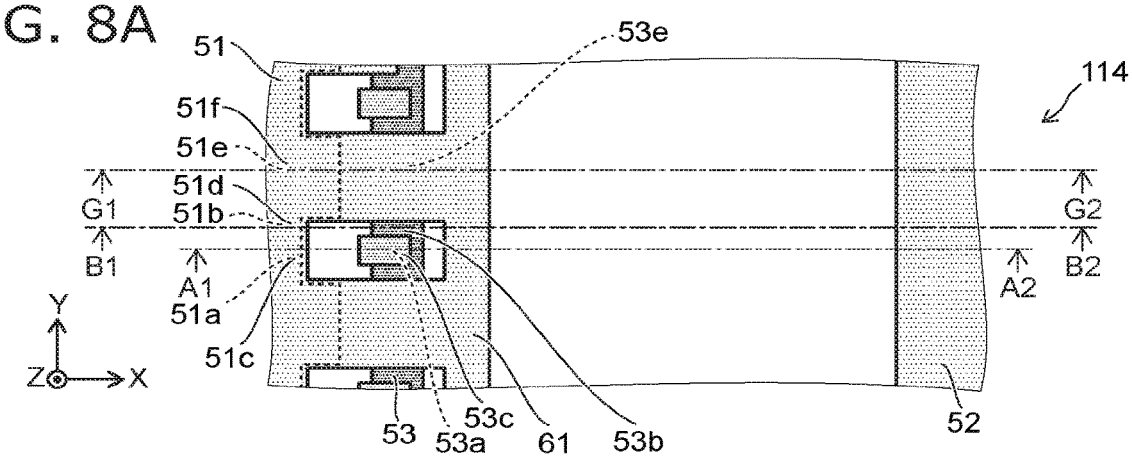
FIG. 8A to FIG. 8D are schematic views illustrating a semiconductor device according to the first embodiment.
Figure 8B:
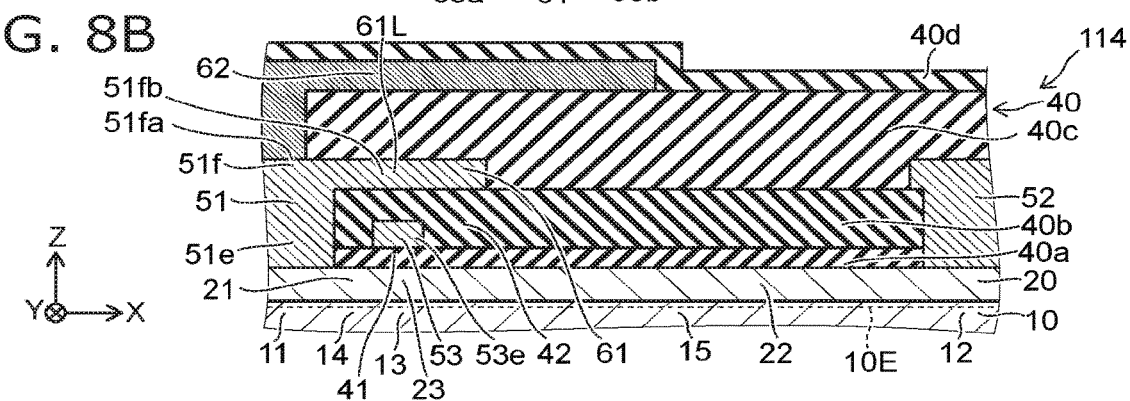
Figure 8C:
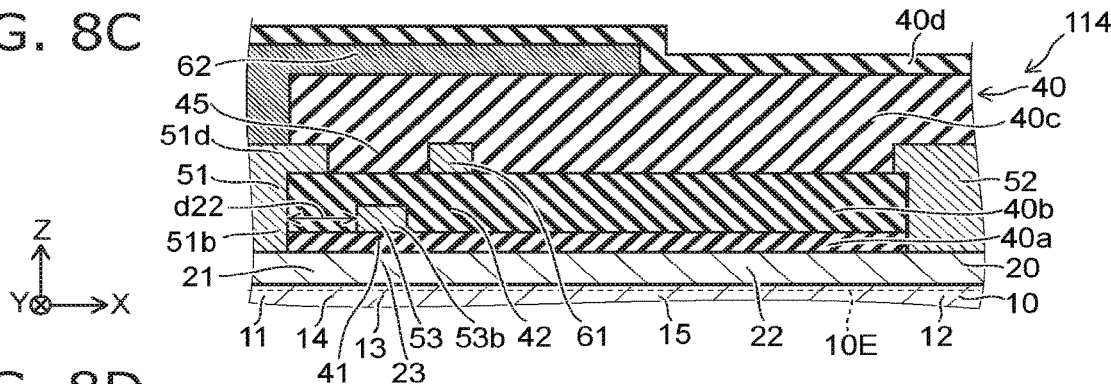
Figure 8D:
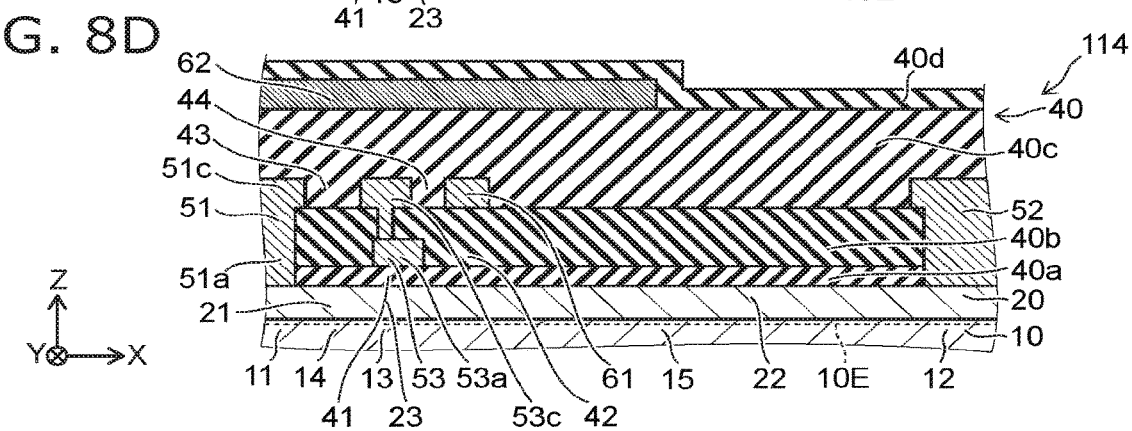

FIG. 8A to FIG. 8D are schematic views illustrating a semiconductor device according to the first embodiment. FIG. 8A is a see-through plan view. The planar configuration of the first electrode 51, the second electrode 52, and the third electrode 53 is schematically shown in FIG. 8A. The insulating member 40 is not illustrated in FIG. 8A. FIG. 8B is a line G1-G2 cross-sectional view of FIG. 8A. FIG. 8C is a line B1-B2 cross-sectional view of FIG. 8A. FIG. 8D is a line A1-A2 cross-sectional view of FIG. 8A.

As shown in FIG. 8B, FIG. 8C, and FIG. 8D, the semiconductor device 114 also includes the first electrode 51, the second electrode 52, the third electrode 53, the first conductive member 61, the first semiconductor layer 10, the second semiconductor layer 20, and the insulating member 40. In the semiconductor device 114, the third electrode 53 includes the fifth portion 53e in addition to the first portion 53a, the second portion 53b, the third portion 53c, and the fourth portion 53d. The first electrode 51 includes the fifth conductive region 51e and the sixth conductive region 51f in addition to the first conductive region 51a, the second conductive region 51b, the third conductive region 51c, and the fourth conductive region 51d. Otherwise, the configuration of the semiconductor device 114 may be similar to that of the semiconductor device 110. Examples of the third electrode 53 and the first electrode 51 of the semiconductor device 114 will now be described.

As shown in FIG. 8A, the second portion 53b is between the first portion 53a and the fifth portion 53e in the third direction (e.g., the Y-axis direction). The second conductive region 51b is between the first conductive region 51a and the fifth conductive region 51e in the third direction. The direction from the fifth conductive region 51e toward the fifth portion 53e is aligned with the first direction (the X-axis direction).

As shown in FIG. 8B, the fifth conductive region 51e is between the first partial region 11 and the portion 51fa of the sixth conductive region 51f in the second direction (e.g., the Z-axis direction).

As shown in FIG. 8B, at least a portion of the fifth portion 53e is between the first insulating region 41 and the other portion 51fb of the sixth conductive region 51f in the second direction (e.g., the Z-axis direction). As shown in FIG. 8A and FIG. 8B, the sixth conductive region 51f is connected to the first conductive member 61. The sixth conductive region 51f functions as the interconnect 61L.

The resistance of the source electrode can be reduced by the sixth conductive region 51f. The first conductive member 61 can function as a field plate due to the first conductive member 61 being connected to the first electrode 51 by the sixth conductive region 51f. For example, the concentration of the electric field can be suppressed; and stable characteristics are obtained easily.

In the semiconductor device 114 as well, the island-shaped third portion 53c is provided. The resistance of the third electrode 53 can be reduced. For example, the distance d22 (referring to FIG. 8C) is shortened easily. For example, a low on-resistance is obtained easily.

FIG. 9A to FIG. 9D are schematic cross-sectional views illustrating a semiconductor device according to the first embodiment.

Figure 9A:
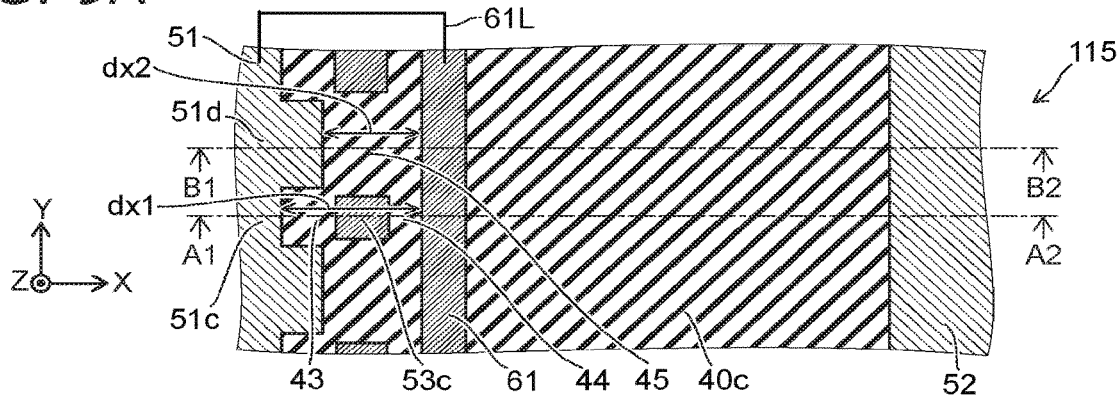
FIG. 9A to FIG. 9D are schematic cross-sectional views illustrating a semiconductor device according to the first embodiment.
Figure 9B:
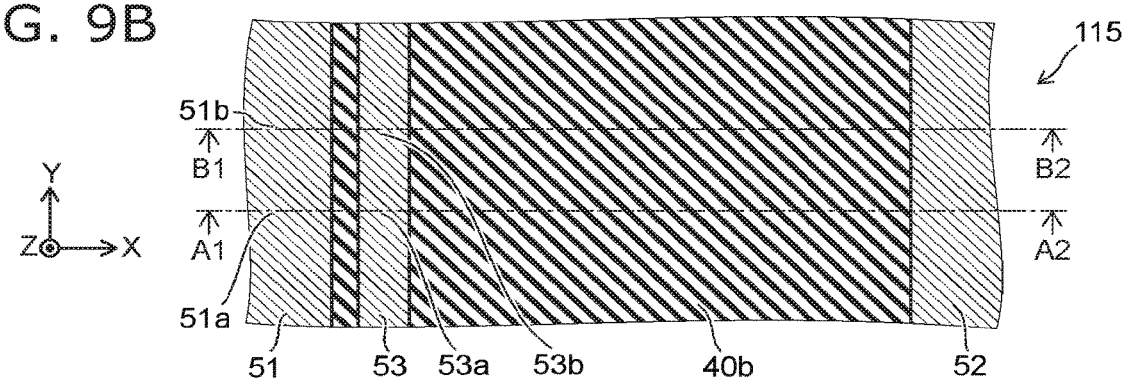
Figure 9C:
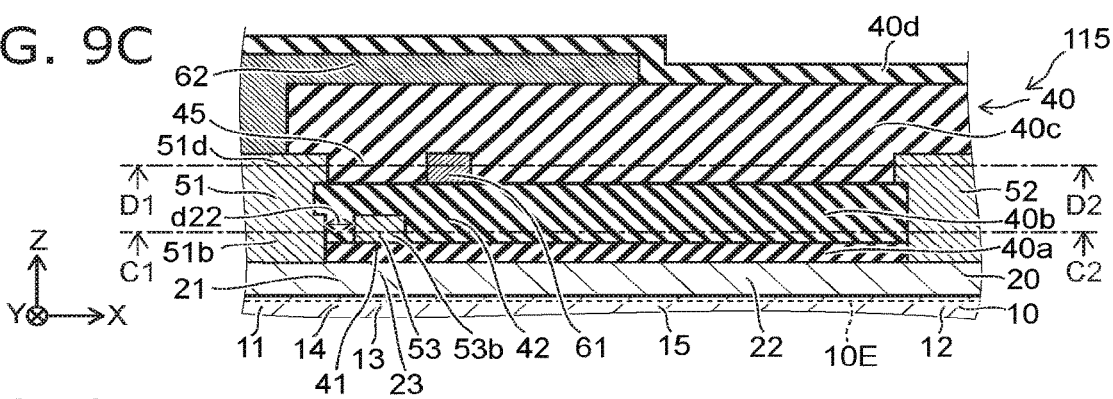
Figure 9D:
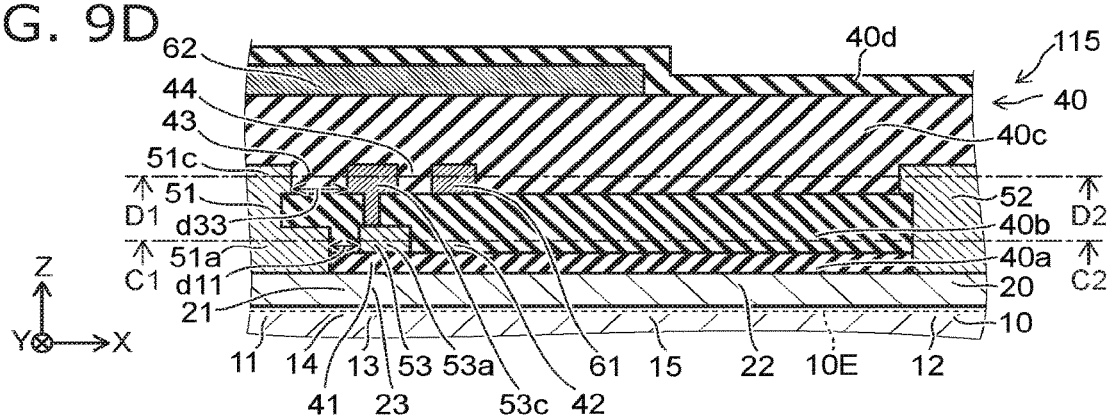

FIG. 9A is a line D1-D2 cross-sectional view of FIG. 9C and FIG. 9D. FIG. 9B is a line C1-C2 cross-sectional view of FIG. 9C and FIG. 9D. FIG. 9C is a line B1-B2 cross-sectional view of FIG. 9A and FIG. 9B. FIG. 9D is a line A1-A2 cross-sectional view of FIG. 9A and FIG. 9B.

As shown in FIG. 9C and FIG. 9D, the semiconductor device 115 according to the embodiment includes the first electrode 51, the second electrode 52, the third electrode 53, the first conductive member 61, the first semiconductor layer 10, the second semiconductor layer 20, and the insulating member 40. In the semiconductor device 115 as shown in FIG. 9B, the position of the end in the X-axis direction of the lower layer portion of the first electrode 51 (the first conductive region 51a and the second conductive region 51b) has a substantially linear configuration. Otherwise, the configuration of the semiconductor device 115 may be similar to that of the semiconductor device 110. Examples of the first electrode 51 and the third electrode 53 of the semiconductor device 115 will now be described.

The island-shaped third portion 53c is provided in the semiconductor device 115 as well. The resistance of the third electrode 53 can be reduced. For example, the distance d22 (referring to FIG. 9C) is shortened easily. For example, a low on-resistance is obtained easily.

As shown in FIG. 9C and FIG. 9D, the insulating member 40 includes the first insulating region 41, the second insulating region 42, the third insulating region 43, the fourth insulating region 44, and the fifth insulating region 45. In the example as well, the first insulating region 41 is between the third partial region 13 and the third electrode 53 in the second direction (e.g., the Z-axis direction). The second insulating region 42 is between the fifth partial region 15 and the first conductive member 61 in the second direction.

As shown in FIG. 9A and FIG. 9D, the third portion 53c is between the third insulating region 43 and the first conductive member 61 in the first direction (the X-axis direction). The fourth insulating region 44 is between the third portion 53c and the first conductive member 61 in the first direction. The fifth insulating region 45 is between the third conductive region 51c and the first conductive member 61 in the first direction. The fifth insulating region 45 contacts the third conductive region 51c and the first conductive member 61.

In the semiconductor device 115, the configuration of the lower layer portion of the first electrode 51 (the first conductive region 51a and the second conductive region 51b) may be different from the configuration of the upper layer portion (the third conductive region 51c and the fourth conductive region 51d).

Second Embodiment

FIG. 10A to FIG. 10D are schematic cross-sectional views illustrating a semiconductor device according to a second embodiment.

Figure 10A:
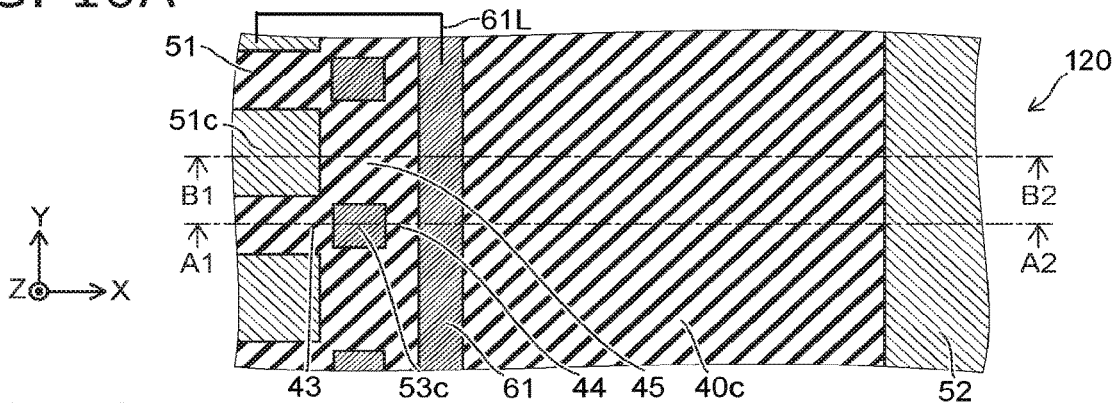
FIG. 10A to FIG. 10D are schematic cross-sectional views illustrating a semiconductor device according to a second embodiment.
Figure 10B:
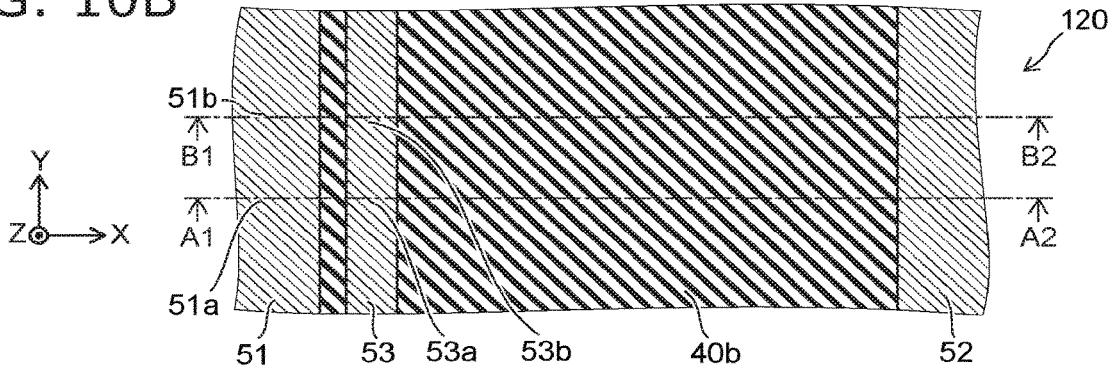
Figure 10C:
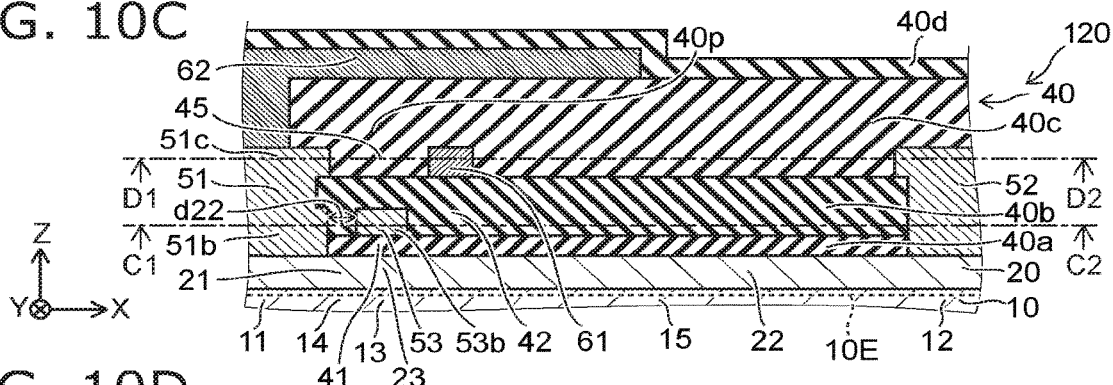
Figure 10D:
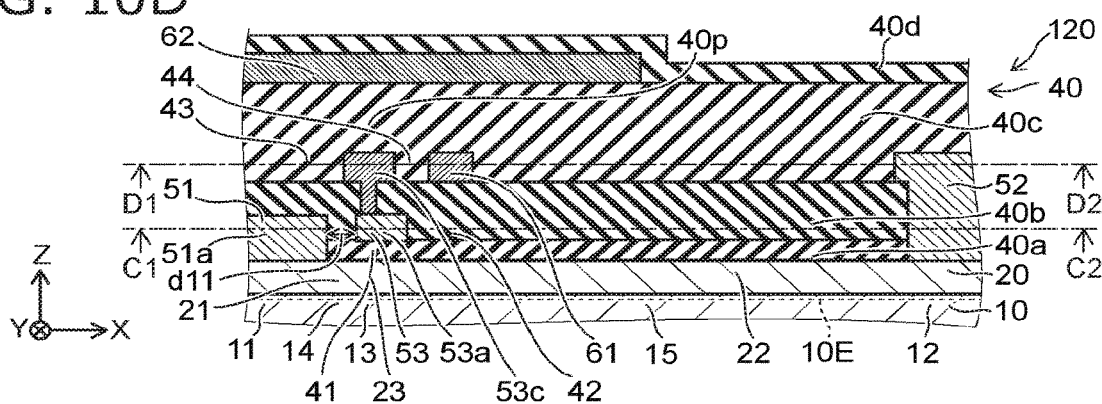

FIG. 10A is a line D1-D2 cross-sectional view of FIG. 10C and FIG. 10D. FIG. 10B is a line C1-C2 cross-sectional view of FIG. 10C and FIG. 10D. FIG. 10C is a line B1-B2 cross-sectional view of FIG. 10A and FIG. 10B. FIG. 10D is a line A1-A2 cross-sectional view of FIG. 10A and FIG. 10B.

As shown in FIG. 10C and FIG. 10D, the semiconductor device 120 according to the embodiment includes the first electrode 51, the second electrode 52, the third electrode 53, the first conductive member 61, the first semiconductor layer 10, the second semiconductor layer 20, and the insulating member 40. In the semiconductor device 120, the third electrode 53 includes the first portion 53a, the second portion 53b, and the third portion 53c. The first electrode 51 includes the first conductive region 51a, the second conductive region 51b, and the third conductive region 51c. In the example as shown in FIG. 10A, the third portion 53c and the third conductive region 51c have island configurations. Otherwise, the configuration of the semiconductor device 120 may be similar to that of the semiconductor device 110. Examples of the first electrode 51 and the third electrode 53 of the semiconductor device 120 will now be described.

In the semiconductor device 120 as shown in FIG. 10A, the direction from the first portion 53a toward the second portion 53b is aligned with the third direction. The third direction crosses a plane including the first direction (the X-axis direction) and the second direction (e.g., the Z-axis direction). The third direction is, for example, the Y-axis direction.

As shown in FIG. 10D, the first portion 53a is between the first insulating region 41 and the third portion 53c in the second direction (the Z-axis direction). The third portion 53c is the upper layer portion of the third electrode 53.

As shown in FIG. 10B and FIG. 10D, the direction from the first conductive region 51a toward the first portion 53a is aligned with the first direction (the X-axis direction). As shown in FIG. 10B and FIG. 10C, the direction from the second conductive region 51b toward the second portion 53b is aligned with the first direction. As shown in FIG. 10C, the second conductive region 51b is between the first partial region 11 and the third conductive region 51c in the second direction (e.g., the Z-axis direction).

As shown in FIG. 10A and FIG. 10D, the third portion 53c is between the third insulating region 43 and the first conductive member 61 in the first direction (the X-axis direction). The fourth insulating region 44 is between the third portion 53c and the first conductive member 61 in the first direction.

As shown in FIG. 10A and FIG. 10C, the fifth insulating region 45 is between the third conductive region 51c and the first conductive member 61 in the first direction (the X-axis direction). The fifth insulating region 45 contacts the third conductive region 51c and the first conductive member 61.

In the semiconductor device 120, for example, the island-shaped third portion 53c and the island-shaped third conductive region 51c are provided. The third portion 53c does not overlap the third conductive region 51c in the X-axis direction.

In the semiconductor device 120, for example, the resistance of the gate electrode can be reduced by the third portion 53c. For example, the resistance of the source electrode can be reduced by the third conductive region 51c.

The third portion 53c does not overlap the third conductive region 51c in the X-axis direction. Thereby, for example, the distance between the first electrode 51 and the third electrode 53 can be short. For example, the distance d22 (referring to FIG. 10C) can be short. A low on-resistance is obtained thereby. For example, the distance d11 (referring to FIG. 10D) can be short. A low on-resistance is obtained thereby.

According to the second embodiment, a semiconductor device can be provided in which the characteristics can be improved.

As shown in FIG. 10A, the multiple third portions 53c may be provided in the semiconductor device 120. For example, the multiple third portions 53c are arranged along the third direction (e.g., the Y-axis direction). The fifth insulating region 45 is between one of the multiple third portions 53c and another one of the multiple third portions 53c in the third direction. The third portion 53c is between one of the multiple fifth insulating regions 45 and another one of the multiple fifth insulating regions 45 in the third direction. For example, the third portion 53c and the fifth insulating region 45 are arranged alternately along the Y-axis direction.

As shown in FIG. 10A, multiple third conductive regions 51c may be provided in the semiconductor device 120. For example, the multiple third conductive regions 51c are arranged along the third direction (e.g., the Y-axis direction). The third insulating region 43 is between one of the multiple third conductive regions 51c and another one of the multiple third conductive regions 51c in the third direction. The third conductive region 51c is between one of the multiple third insulating regions 43 and another one of the multiple third insulating regions 43 in the third direction. For example, the third conductive region 51c and the third insulating region 43 are arranged alternately along the Y-axis direction.

The ratio of the length along the third direction (e.g., the Y-axis direction) of one of the multiple third portions 53c to the length along the third direction of one of the multiple third conductive regions 51c is, for example, not less than 0.1 and not more than 10. Good switching characteristics are easier to obtain thereby.

FIG. 11A to FIG. 11D are schematic cross-sectional views illustrating a semiconductor device according to the second embodiment.

Figure 11A:
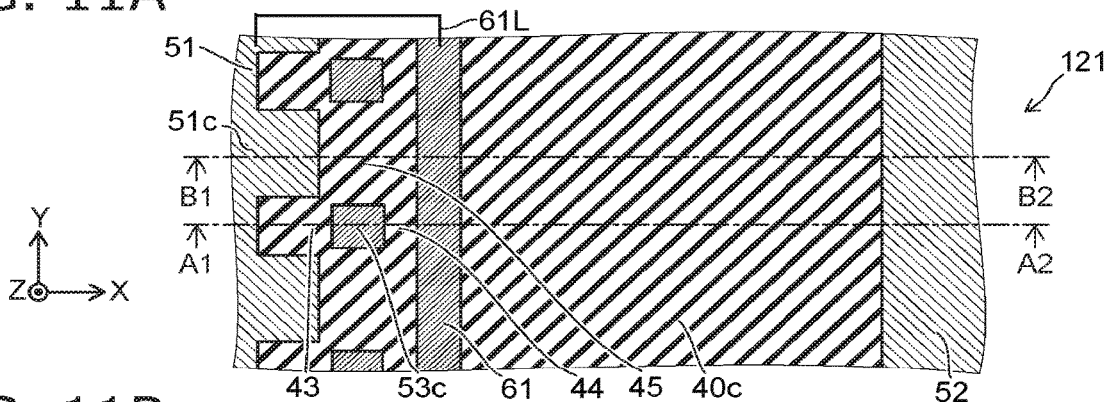
FIG. 11A to FIG. 11D are schematic cross-sectional views illustrating a semiconductor device according to the second embodiment.
Figure 11B:
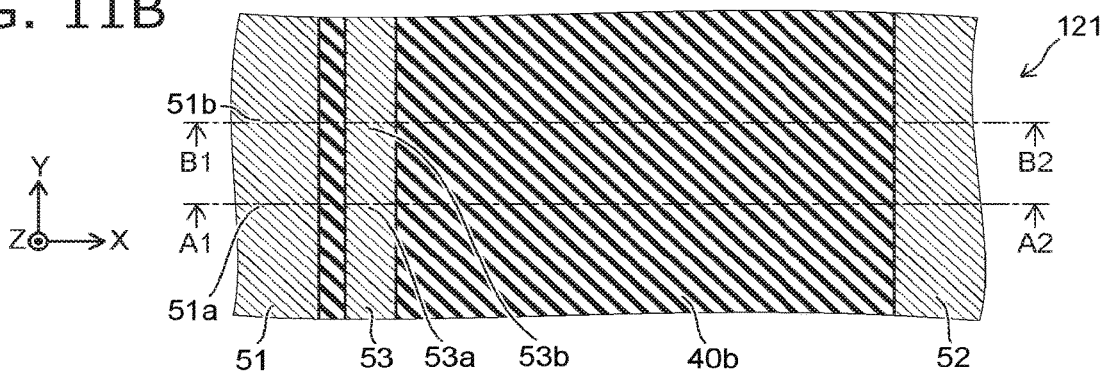
Figure 11C:
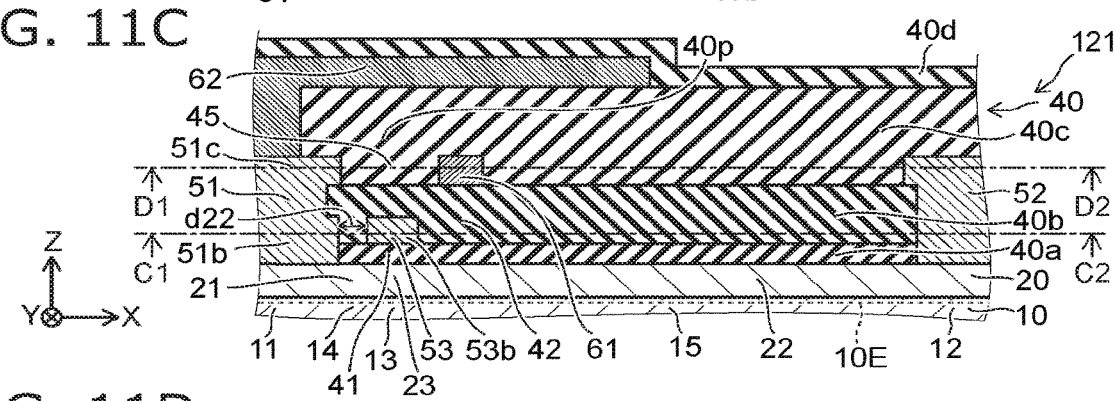
Figure 11D:
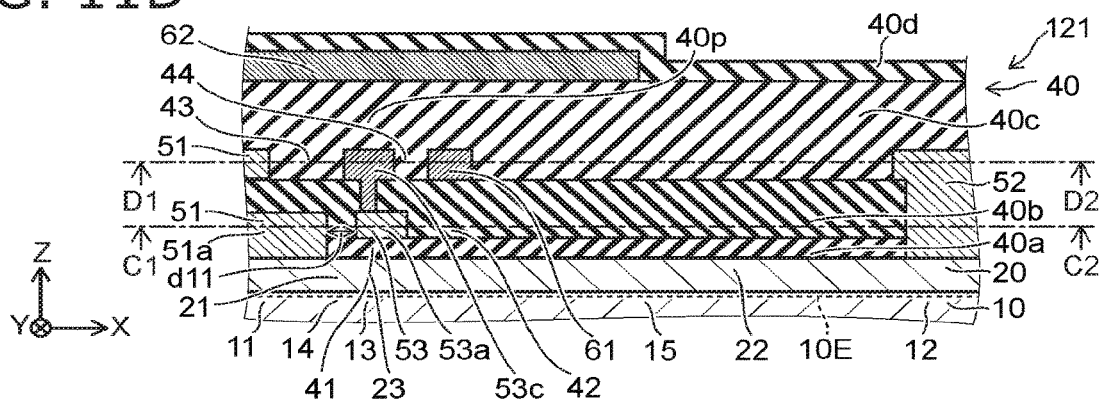

FIG. 11A is a line D1-D2 cross-sectional view of FIG. 11C and FIG. 11D. FIG. 11B is a line C1-C2 cross-sectional view of FIG. 11C and FIG. 11D. FIG. 11C is a line B1-B2 cross-sectional view of FIG. 11A and FIG. 11B. FIG. 11D is a line A1-A2 cross-sectional view of FIG. 11A and FIG. 11B.

As shown in FIG. 11C and FIG. 11D, the semiconductor device 121 according to the embodiment also includes the first electrode 51, the second electrode 52, the third electrode 53, the first conductive member 61, the first semiconductor layer 10, the second semiconductor layer 20, and the insulating member 40. In the semiconductor device 121 as well, the third electrode 53 includes the first portion 53a, the second portion 53b, and the third portion 53c. The first electrode 51 includes the first conductive region 51a, the second conductive region 51b, and the third conductive region 51c. In the semiconductor device 121 as shown in FIG. 10A, the multiple third conductive regions 51c are connected by a connection region having a narrow width. Otherwise, the configuration of the semiconductor device 121 is similar to that of the semiconductor device 112. In the semiconductor device 121 as well, for example, the resistance of the source electrode can be reduced. For example, a low on-resistance is obtained.

Third Embodiment

FIG. 12A to FIG. 12D are schematic cross-sectional views illustrating a semiconductor device according to a third embodiment.

Figure 12A:
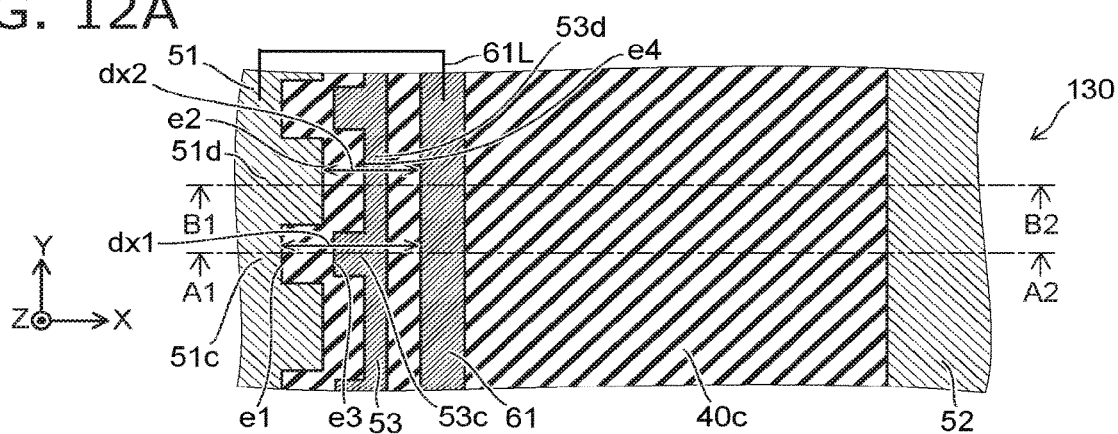
FIG. 12A to FIG. 12D are schematic cross-sectional views illustrating a semiconductor device according to a third embodiment.
Figure 12B:
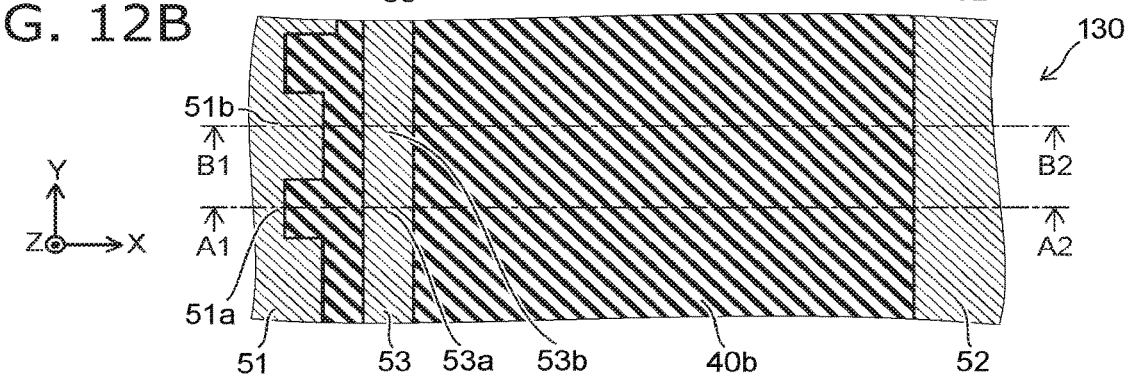
Figure 12C:
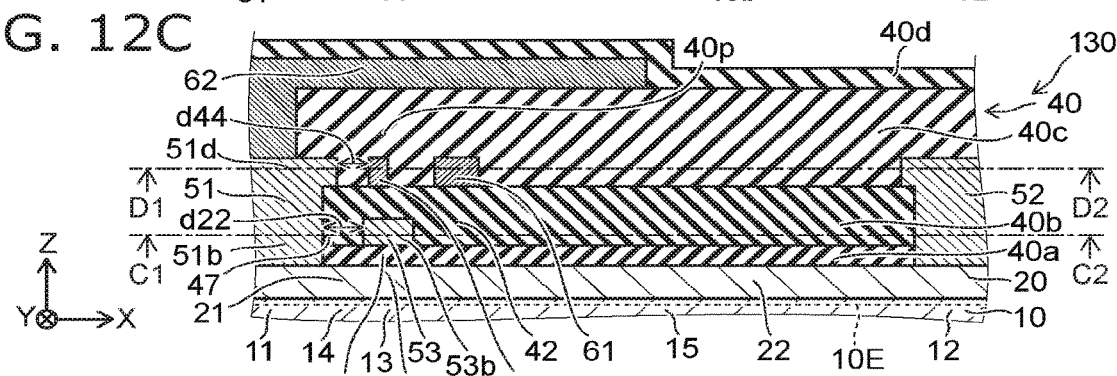
Figure 12D:
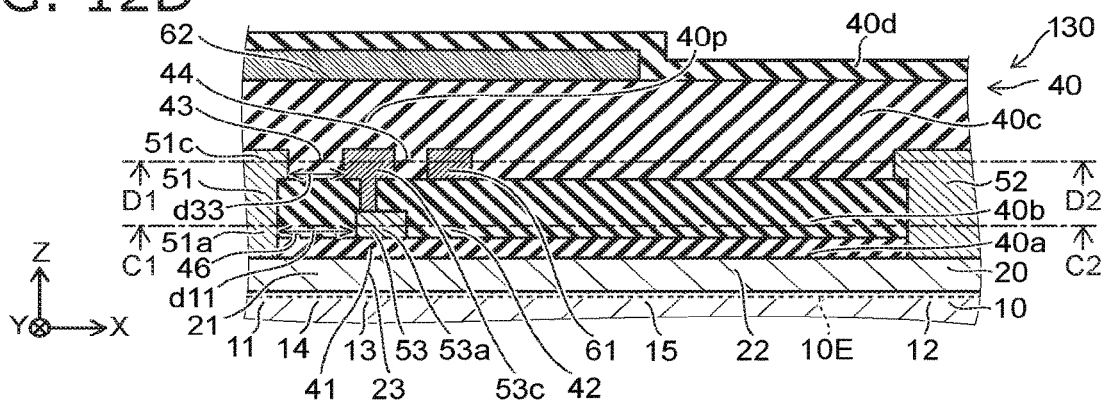

FIG. 12A is a line D1-D2 cross-sectional view of FIG. 12C and FIG. 12D. FIG. 12B is a line C1-C2 cross-sectional view of FIG. 12C and FIG. 12D. FIG. 12C is a line B1-B2 cross-sectional view of FIG. 12A and FIG. 12B. FIG. 12D is a line A1-A2 cross-sectional view of FIG. 12A and FIG. 12B.

As shown in FIG. 12C and FIG. 12D, the semiconductor device 130 according to the embodiment includes the first electrode 51, the second electrode 52, the third electrode 53, the first semiconductor layer 10, the second semiconductor layer 20, and the insulating member 40. In the semiconductor device 130, the upper layer portion of the third electrode 53 has a band configuration continuous with the Y-axis direction. Otherwise, the configuration of the semiconductor device 130 may be similar to that of the semiconductor device 110. Examples of the third electrode 53 and the first electrode 51 of the semiconductor device 130 will now be described.

As shown in FIG. 12A to FIG. 12D, the third electrode 53 includes the first portion 53a, the second portion 53b, the third portion 53c, and the fourth portion 53d. As shown in FIG. 12B, the direction from the first portion 53a toward the second portion 53b is aligned with the third direction. The third direction crosses a plane including the first direction (the X-axis direction) and the second direction (e.g., the Z-axis direction). The third direction is, for example, the Y-axis direction.

As shown in FIG. 12D, the first portion 53a is between the first insulating region 41 and the third portion 53c in the second direction (e.g., the Z-axis direction). As shown in FIG. 12C, the second portion 53b is between the first insulating region 41 and the fourth portion 53d in the second direction.

The first electrode 51 includes the first conductive region 51a, the second conductive region 51b, the third conductive region 51c, and the fourth conductive region 51d. The direction from the first conductive region 51a toward the first portion 53a is aligned with the first direction (the X-axis direction). The direction from the second conductive region 51b toward the second portion 53b is aligned with the first direction.

As shown in FIG. 12D, the first conductive region 51a is between the first partial region 11 and the third conductive region 51c in the second direction (e.g., the Z-axis direction). As shown in FIG. 12C, the second conductive region 51b is between the first partial region 11 and the fourth conductive region 51d in the second direction.

As shown in FIG. 12A and FIG. 12D, the direction from the third conductive region 51c toward the third portion 53c is aligned with the first direction (the X-axis direction). As shown in FIG. 12A and FIG. 12C, the direction from the fourth conductive region 51d toward the fourth portion 53d is aligned with the first direction.

As shown in FIG. 12A, the third conductive region 51c includes a first end portion e1 at the third portion 53c side. The fourth conductive region 51d includes a second end portion e2 at the fourth portion 53d side. The third portion 53c includes a third end portion e3 at the third conductive region 51c side. The fourth portion 53d includes a fourth end portion e4 at the fourth conductive region 51d side. The position along the first direction (the X-axis direction) of the second end portion e2 is between the position along the first direction of the first end portion e1 and the position along the first direction of the third end portion e3. The position along the first direction of the third end portion e3 is between the position along the first direction of the second end portion e2 and the position along the first direction of the fourth end portion e4.

In the first electrode 51 of the semiconductor device 130, the third conductive region 51c and the fourth conductive region 51d of the upper layer portion have an uneven configuration. In the third electrode 53, the third portion 53c and the fourth portion 53d of the upper layer portion have an uneven configuration. The recess of the upper layer portion of the first electrode 51 corresponds to the protrusion of the upper layer portion of the third electrode 53. The protrusion of the upper layer portion of the first electrode 51 corresponds to the recess of the upper layer portion of the third electrode 53.

The resistance of the gate electrode can be reduced by the upper layer portion of the third electrode 53. The resistance of the source electrode can be reduced by the upper layer portion of the first electrode 51. By setting the configurations of these upper layer portions to be uneven configurations such as those recited above, good insulation performance is obtained easily when the first electrode 51 and the third electrode 53 are proximal to each other. The distance between the first electrode 51 and the third electrode 53 can be small. For example, the distance d22 (referring to FIG. 12C) can be small. For example, a low on-resistance is obtained easily. According to the third embodiment, a semiconductor device can be provided in which the characteristics can be improved.

As shown in FIG. 12A, multiple third portions 53c may be provided in the semiconductor device 130. For example, the multiple third portions 53c are arranged along the third direction (e.g., the Y-axis direction). The fourth portion 53d is between one of the multiple third portions 53c and another one of the multiple third portions 53c in the third direction. The third portion 53c is between one of the multiple fourth portions 53d and another one of the multiple fourth portions 53d in the third direction. For example, the third portion 53c and the fourth portion 53d are arranged alternately along the Y-axis direction.

The ratio of the length along the third direction (e.g., the Y-axis direction) of one of the multiple third portions 53c to the length along the third direction of one of the multiple fourth portions 53d is, for example, not less than 0.1 and not more than 10. Good switching characteristics are easier to obtain thereby.

As shown in FIG. 12C, the distance along the first direction (the X-axis direction) between the fourth conductive region 51d and the fourth portion 53d is taken as a distance d44. The distance along the first direction between the second conductive region 51b and the second portion 53b is taken as the distance d22. For example, the distance d44 is longer than the distance d22. For example, a low on-resistance is obtained by the short distance d22. Electrical shorts can be suppressed by the long distance d44.

As shown in FIG. 12D, the distance along the first direction (the X-axis direction) between the third conductive region 51c and the third portion 53c is taken as the distance d33. The distance d33 is longer than the distance d22 along the first direction between the second conductive region 51b and the second portion 53b. For example, a low on-resistance is obtained. Electrical shorts can be suppressed by the long distance d33.

As shown in FIG. 12D, the distance along the first direction between the first conductive region 51a and the first portion 53a is taken as the distance d11. The distance d11 may be longer than the distance d22. The distance d11 may be the same as or shorter than the distance d22.

The semiconductor device 130 may include the first conductive member 61. The first conductive member 61 is electrically connected to the first electrode 51. As shown in FIG. 12A, for example, the first conductive member 61 is electrically connected to the first electrode 51 by the interconnect 61L. The third portion 53c is between the third conductive region 51c and a portion of the first conductive member 61 in the first direction (the X-axis direction). The fourth portion 53d is between the fourth conductive region 51d and another portion of the first conductive member 61 in the first direction.

As shown in FIG. 12A, for example, the distance dx1 along the first direction between the third conductive region 51c and the first conductive member 61 is longer than the distance dx2 along the first direction between the fourth conductive region 51d and the first conductive member 61.

In the semiconductor device 130 as shown in FIG. 12C and FIG. 12D as well, the second semiconductor layer 20 may further include the third semiconductor region 23. The third semiconductor region 23 is between the third partial region 13 and the first insulating region 41 in the second direction (the Z-axis direction).

In the first to third embodiments, the electrodes (the first electrode 51, the second electrode 52, the third electrode 53, etc.) include, for example, at least one selected from the group consisting of Ti, Al, and Au. The electrode (the third electrode 53) includes, for example, at least one selected from the group consisting of TiN, WN, TaN, Ni, Au, and Mo. The conductive members (the first conductive member 61, etc.) include, for example, at least one selected from the group consisting of Al, Cu, and Ti. The insulating member 40 includes, for example, at least one selected from the group consisting of $SiO_2$, SiN, and SiON.

According to the embodiment, a semiconductor device can be provided in which the characteristics can be improved.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a third electrode, a position of the third electrode in a first direction being between a position of the first electrode in the first direction and a position of the second electrode in the first direction, the first direction being from the first electrode toward the second electrode;
a first conductive member electrically connected to the first electrode, a position of the first conductive member in the first direction being between the position of the third electrode in the first direction and the position of the second electrode in the first direction;
a first semiconductor layer including $Al_{x1}Ga_{1-x1}N$ ($0 \leq x1 < 1$) and including a first partial region, a second partial region, a third partial region, a fourth partial region, and a fifth partial region, a second direction being from the first partial region toward the first electrode and crossing the first direction, a direction from the second partial region toward the second electrode being aligned with the second direction, a direction from the third partial region toward the third electrode being aligned with the second direction, the fourth partial region being between the first partial region and the third partial region in the first direction, the fifth partial region being between the third partial region and the second partial region in the first direction;
a second semiconductor layer including $Al_{x2}Ga_{1-x2}N$ ($0 < x2 < 1$ and $x1 < x2$) and including a first semiconductor region and a second semiconductor region, a direction from the fourth partial region toward the first semiconductor region being aligned with the second direction, a direction from the fifth partial region toward the second semiconductor region being aligned with the second direction; and
an insulating member including a first insulating region, a second insulating region, a third insulating region, a fourth insulating region, and a fifth insulating region, the first insulating region being between the third partial region and the third electrode in the second direction, the second insulating region being between the fifth partial region and the first conductive member in the second direction,
the third electrode including a first portion, a second portion, and a third portion, a direction from the first portion toward the second portion being aligned with a third direction crossing a plane including the first direction and the second direction, the first portion being between the first insulating region and the third portion in the second direction,
the first electrode including a first conductive region, a second conductive region, a third conductive region, and a fourth conductive region, a direction from the first conductive region toward the first portion being aligned with the first direction, a direction from the third conductive region toward the third portion being aligned with the first direction, a direction from the second conductive region toward the second portion being aligned with the first direction, the first conductive region being between the first partial region and the third conductive region in the second direction, the second conductive region being between the first partial region and the fourth conductive region in the second direction, the third insulating region being between the third conductive region and the third portion in the first direction, the fourth insulating region being between the third portion and the first conductive member in the first direction, the fifth insulating region contacting the fourth conductive region and the first conductive member and being between the fourth conductive region and the first conductive member in the first direction, wherein a distance in the first direction between the third conductive region and the first conductive member is longer than a distance in the first direction between the fourth conductive region and the first conductive member.

2. The device according to claim 1, wherein
the insulating member further includes a sixth insulating region,
the sixth insulating region is between the first partial region and a portion of the third conductive region in the second direction, and
the sixth insulating region is between the first conductive region and the first portion in the first direction.

3. The device according to claim 2, wherein
the insulating member further includes a seventh insulating region,
the seventh insulating region is between the first partial region and a portion of the fourth conductive region in the second direction, and
the seventh insulating region is between the second conductive region and the second portion in the first direction.

4. The device according to claim 1, wherein
a plurality of the third portions is provided, and
the fifth insulating region is between one of the plurality of third portions and an other one of the plurality of third portions in the third direction.

5. The device according to claim 1, wherein
a plurality of the fifth insulating regions is provided, and
the third portion is between one of the plurality of fifth insulating regions and an other one of the plurality of fifth insulating regions in the third direction.

6. The device according to claim 1, further comprising a second conductive member electrically connected to the first electrode,
the third electrode being between the first insulating region and the second conductive member in the second direction,
a portion of the insulating member being between the third electrode and the second conductive member in the second direction.

7. The device according to claim 1, further comprising a second conductive member and a third conductive member electrically connected to the first electrode,
the first electrode being between the first partial region and the second conductive member in the second direction,
the first conductive member being between the second insulating region and the third conductive member in the second direction,
the position of the third electrode in the first direction being between a position of the second conductive member in the first direction and a position of the third conductive member in the first direction.

8. The device according to claim 7, further comprising a fourth conductive member electrically connected to the third electrode,
the fourth conductive member being between the second conductive member and the third conductive member in the first direction.

9. The device according to claim 8, wherein
the third portion is between the first portion and a portion of the fourth conductive member in the second direction, and
the fifth insulating region is between the second portion and an other portion of the fourth conductive member in the second direction.

10. The device according to claim 1, further comprising a fifth conductive member electrically connected to the third electrode,
the third portion being between the first portion and a portion of the fifth conductive member in the second direction,
the fifth insulating region being between the second portion and an other portion of the fifth conductive member in the second direction.

11. The device according to claim 1, wherein
the third electrode further includes a fifth portion,
the first electrode further includes a fifth conductive region and a sixth conductive region,
the second portion is between the first portion and the fifth portion in the third direction,
the second conductive region is between the first conductive region and the fifth conductive region in the third direction,
a direction from the fifth conductive region toward the fifth portion is aligned with the first direction,
the fifth conductive region is between the first partial region and a portion of the sixth conductive region in the second direction, and
at least a portion of the fifth portion is between the first insulating region and an other portion of the sixth conductive region in the second direction.

12. The device according to claim 11, wherein the sixth conductive region is connected to the first conductive member.

13. The device according to claim 1, wherein
the second semiconductor layer further includes a third semiconductor region, and
the third semiconductor region is between the third partial region and the first insulating region in the second direction.

14. A semiconductor device, comprising:
a first electrode;
a second electrode;
a third electrode, a position of the third electrode in a first direction being between a position of the first electrode in the first direction and a position of the second electrode in the first direction, the first direction being from the first electrode toward the second electrode;
a first conductive member electrically connected to the first electrode, a position of the first conductive member in the first direction being between the position of the third electrode in the first direction and the position of the second electrode in the first direction;
a first semiconductor layer including $Al_{x12}Ga_{1-x1}N$ ($0 \leq x1 < 1$) and including a first partial region, a second partial region, a third partial region, a fourth partial region, and a fifth partial region, a second direction being from the first partial region toward the first electrode and crossing the first direction, a direction from the second partial region toward the second electrode being aligned with the second direction, a direction from the third partial region toward the third electrode being aligned with the second direction, the fourth partial region being between the first partial region and the third partial region in the first direction, the fifth partial region being between the third partial region and the second partial region in the first direction;

a second semiconductor layer including $Al_{x2}Ga_{1-x2}N$ ($0<x2<1$ and $x1<x2$) and including a first semiconductor region and a second semiconductor region, a direction from the fourth partial region toward the first semiconductor region being aligned with the second direction, a direction from the fifth partial region toward the second semiconductor region being aligned with the second direction; and an insulating member including a first insulating region, a second insulating region, a third insulating region, a fourth insulating region, and a fifth insulating region, the first insulating region being between the third partial region and the third electrode in the second direction, the second insulating region being between the fifth partial region and the first conductive member in the second direction, the third electrode including a first portion, a second portion, and a third portion, a direction from the first portion toward the second portion being aligned with a third direction crossing a plane including the first direction and the second direction, the first portion being between the first insulating region and the third portion in the second direction, the first electrode including a first conductive region, a second conductive region, a third conductive region, and a fourth conductive region, a direction from the first conductive region toward the first portion being aligned with the first direction, a direction from the third conductive region toward the third portion being aligned with the first direction, a direction from the second conductive region toward the second portion being aligned with the first direction, the first conductive region being between the first partial region and the third conductive region in the second direction, the second conductive region being between the first partial region and the fourth conductive region in the second direction, the third insulating region being between the third conductive region and the third portion in the first direction, the fourth insulating region being between the third portion and the first conductive member in the first direction, the fifth insulating region contacting the fourth conductive region and the first conductive member and being between the fourth conductive region and the first conductive member in the first direction, the third portion not provided between the fourth conductive region and the first conductive member.

* * * * *